United States Patent
Krall et al.

(10) Patent No.: US 12,306,214 B2
(45) Date of Patent: May 20, 2025

(54) ADJUSTABLE SENSITIVITY RANGES FOR MAGNETIC FIELD SENSORS

(71) Applicant: Infineon Technologies AG, Neubiberg (DE)

(72) Inventors: Christoph Krall, Klagenfurt (AT); Gernot Binder, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 356 days.

(21) Appl. No.: 18/066,687

(22) Filed: Dec. 15, 2022

(65) Prior Publication Data

US 2024/0201230 A1   Jun. 20, 2024

(51) Int. Cl.
*G01R 15/20* (2006.01)
*G01R 19/25* (2006.01)

(52) U.S. Cl.
CPC .......... *G01R 15/207* (2013.01); *G01R 19/25* (2013.01)

(58) Field of Classification Search
CPC ... G01R 15/207; G01R 19/25; G01R 19/0092
See application file for complete search history.

(56) References Cited

U.S. PATENT DOCUMENTS

| | | | |
|---|---|---|---|
| 9,081,041 B2 * | 7/2015 | Friedrich | G01R 15/207 |
| 10,935,612 B2 | 3/2021 | Belin et al. | |
| 2012/0126833 A1 * | 5/2012 | Dooley | G01N 27/90 |
| | | | 324/657 |
| 2017/0276740 A1 | 9/2017 | Schmitt et al. | |
| 2019/0229640 A1 * | 7/2019 | Aichriedler | H02M 7/003 |
| 2019/0277874 A1 | 9/2019 | Hainz et al. | |
| 2020/0041310 A1 | 2/2020 | Lassalle-Balier et al. | |
| 2020/0088600 A1 * | 3/2020 | Raimarckers | G01L 9/0052 |
| 2022/0136865 A1 | 5/2022 | Schroers et al. | |

FOREIGN PATENT DOCUMENTS

| | | | |
|---|---|---|---|
| CN | 204556804 U | 8/2015 | |
| CN | 111322938 A | 6/2020 | |
| GB | 2009947 A * | 6/1979 | G01L 1/225 |
| JP | 6372946 B2 * | 8/2018 | B60L 3/0069 |

* cited by examiner

*Primary Examiner* — Christopher P McAndrew
(74) *Attorney, Agent, or Firm* — Harrity & Harrity, LLP

(57) ABSTRACT

A current sensor includes a selector switch configured to output a first pair of differential sensor signals and a second pair of differential sensor signals if configured in a first switch state, and output a third pair of differential sensor signals and a fourth pair of differential sensor signals if configured in a second switch state; and a differential circuit coupled to the selector switch. If the selector switch is configured in the first switch state, the differential circuit is configured to generate a first output signal representative of a first difference between the first and the second pairs of differential sensor signals. If the selector switch is configured in the second switch state, the differential circuit is configured to generate a second output signal representative of a second difference between the third and the fourth pairs of differential sensor signals.

22 Claims, 7 Drawing Sheets

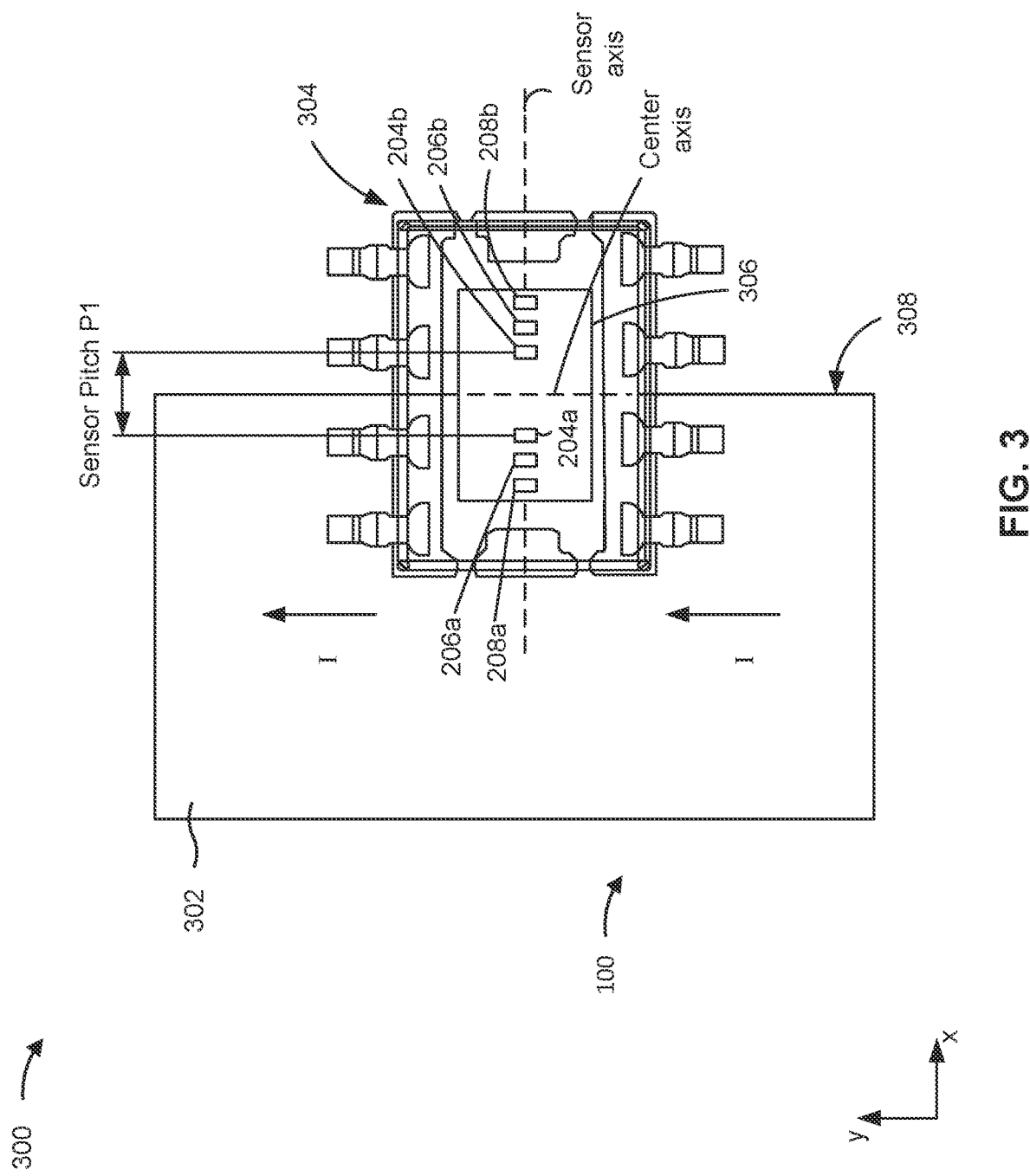

ADJUSTABLE SENSITIVITY RANGES FOR MAGNETIC FIELD SENSORS

BACKGROUND

There are many applications in which measuring an electric current is desired. As one example, it may be desired to measure one or more electric currents of a battery system of an electric vehicle. In another example, it may be desired to measure one or more electric currents provided to a load, such as an electric motor. In yet further examples, it may be desired to measure one or more electric currents of a power distribution system or one or more electric currents in a circuit.

Because an electric current flowing through a current-carrying conductor produces a magnetic field with a magnetic field flux density that is proportional to a magnitude of the electric current, magnetic field sensors can be used as current sensors. By placing a magnetic field sensor near the current-carrying conductor, the magnetic field sensor can generate a measurable quantity, such as a voltage, that is proportional to the magnetic field sensed by the magnetic field sensor. However, it is noted that the magnetic field flux density in a space around the current-carrying conductor reduces inversely with increasing distance from the current-carrying conductor. Therefore, a sensor element of the magnetic field sensor is placed in close proximity to the current-carrying conductor.

SUMMARY

In some implementations, a current sensor includes a first magnetic field sensor circuit comprising a first plurality of sensor bridges including a first sensor bridge configured to generate a first pair of differential sensor signals and a second sensor bridge configured to generate a second pair of differential sensor signals, wherein the first sensor bridge and the second sensor bridge are laterally separated along a sensor axis by a first sensor pitch, wherein the first sensor bridge comprises a first plurality of magnetic field sensing elements electrically coupled in a first full-bridge circuit configuration, and wherein the second sensor bridge comprises a second plurality of magnetic field sensing elements electrically coupled in a second full-bridge circuit configuration; a second magnetic field sensor circuit comprising a second plurality of sensor bridges including a third sensor bridge configured to generate a third pair of differential sensor signals and a fourth sensor bridge configured to generate a fourth pair of differential sensor signals, wherein the third sensor bridge and the fourth sensor bridge are laterally separated along the sensor axis by a second sensor pitch that is different from the first sensor pitch, wherein the third sensor bridge comprises a third plurality of magnetic field sensing elements electrically coupled in a third full-bridge circuit configuration, and wherein the fourth sensor bridge comprises a fourth plurality of magnetic field sensing elements electrically coupled in a fourth full-bridge circuit configuration; a selector switch configurable in a plurality of switch states, wherein the selector switch is configured to simultaneously receive the first pair of differential sensor signals, the second pair of differential sensor signals, the third pair of differential sensor signals, and the fourth pair of differential sensor signals, output the first pair of differential sensor signals and the second pair of differential sensor signals if configured in a first switch state of the plurality of switch states, and output the third pair of differential sensor signals and the fourth pair of differential sensor signals if configured in a second switch state of the plurality of switch states; and a differential circuit coupled to the selector switch, wherein, if the selector switch is configured in the first switch state, the differential circuit is configured to receive the first pair of differential sensor signals and the second pair of differential sensor signals, and generate a first output signal representative of a first difference between the first pair of differential sensor signals and the second pair of differential sensor signals, and wherein, if the selector switch is configured in the second switch state, the differential circuit is configured to receive the third pair of differential sensor signals and the fourth pair of differential sensor signals, and generate a second output signal representative of a second difference between the third pair of differential sensor signals and the fourth pair of differential sensor signals.

In some implementations, a current sensor includes a first magnetic field sensor circuit comprising a first sensor bridge circuit configured to generate a first differential sensor signal and a second sensor bridge circuit configured to generate a second differential sensor signal, wherein the first sensor bridge circuit comprises a first sensor bridge comprising a first plurality of magnetic field sensing elements electrically coupled in a first full-bridge circuit configuration, wherein the second sensor bridge circuit comprises a second sensor bridge comprising a second plurality of magnetic field sensing elements electrically coupled in a second full-bridge circuit configuration, and wherein the first sensor bridge and the second sensor bridge are laterally separated along a sensor axis by a first sensor pitch; a second magnetic field sensor circuit comprising a third sensor bridge circuit configured to generate a third differential sensor signal and a fourth sensor bridge circuit configured to generate a fourth differential sensor signal, wherein the third sensor bridge circuit comprises a third sensor bridge comprising a third plurality of magnetic field sensing elements electrically coupled in a third full-bridge circuit configuration, and wherein the fourth sensor bridge circuit comprises a fourth sensor bridge comprising a fourth plurality of magnetic field sensing elements electrically coupled in a fourth full-bridge circuit configuration, wherein the third sensor bridge and the fourth sensor bridge are laterally separated along the sensor axis by a second sensor pitch that is different from the first sensor pitch; a selector switch configurable in a plurality of switch states, wherein the selector switch is configured to simultaneously receive the first differential sensor signal, the second differential sensor signal, the third differential sensor signal, and the fourth differential sensor signal, output the first differential sensor signal and the second differential sensor signal if configured in a first switch state of the plurality of switch states, and output the third differential sensor signal and the fourth differential sensor signal if configured in a second switch state of the plurality of switch states; and a differential circuit coupled to the selector switch, wherein, if the selector switch is configured in the first switch state, the differential circuit is configured to receive the first differential sensor signal and the second differential sensor signal, and generate a first output signal representative of a first difference between the first differential sensor signal and the second differential sensor signal, and wherein, if the selector switch is configured in the second switch state, the differential circuit is configured to receive the third differential sensor signal and the fourth differential sensor signal, and generate a second output signal representative of a second difference between the third differential sensor signal and the fourth differential sensor signal.

In some implementations, a method for measuring a current includes generating, by a first sensor bridge, a first pair of differential sensor signals, wherein the first sensor bridge comprises a first plurality of magnetic field sensing elements electrically coupled in a first full-bridge circuit configuration; generating, by a second sensor bridge, a second pair of differential sensor signals, wherein the second sensor bridge comprises a second plurality of magnetic field sensing elements electrically coupled in a second full-bridge circuit configuration, and wherein the first sensor bridge and the second sensor bridge are laterally separated along a sensor axis by a first sensor pitch; generating, by a third sensor bridge, a third pair of differential sensor signals, wherein the third sensor bridge comprises a third plurality of magnetic field sensing elements electrically coupled in a third full-bridge circuit configuration; generating, by a fourth sensor bridge, a fourth pair of differential sensor signals, wherein the fourth sensor bridge comprises a fourth plurality of magnetic field sensing elements electrically coupled in a fourth full-bridge circuit configuration, and wherein the third sensor bridge and the fourth sensor bridge are laterally separated along the sensor axis by a second sensor pitch that is different from the first sensor pitch; outputting, by a selector switch, the first pair of differential sensor signals and the second pair of differential sensor signals based on the selector switch being configured in a first switch state of a plurality of switch states; outputting, by a selector switch, the third pair of differential sensor signals and the fourth pair of differential sensor signals based on the selector switch being configured in a second switch state of the plurality of switch states; on a first condition that the selector switch is configured in the first switch state, generating a first output signal representative of a first difference between the first pair of differential sensor signals and the second pair of differential sensor signals, wherein the first output signal represents the current; and on a second condition that the selector switch is configured in the second switch state, generating a second output signal representative of a second difference between the third pair of differential sensor signals and the fourth pair of differential sensor signals, wherein the second output signal represents the current.

BRIEF DESCRIPTION OF THE DRAWINGS

Implementations are described herein with reference to the appended drawings.

FIG. 3 illustrates a current sensor arrangement according to one or more implementations.

DETAILED DESCRIPTION

Figure 1:
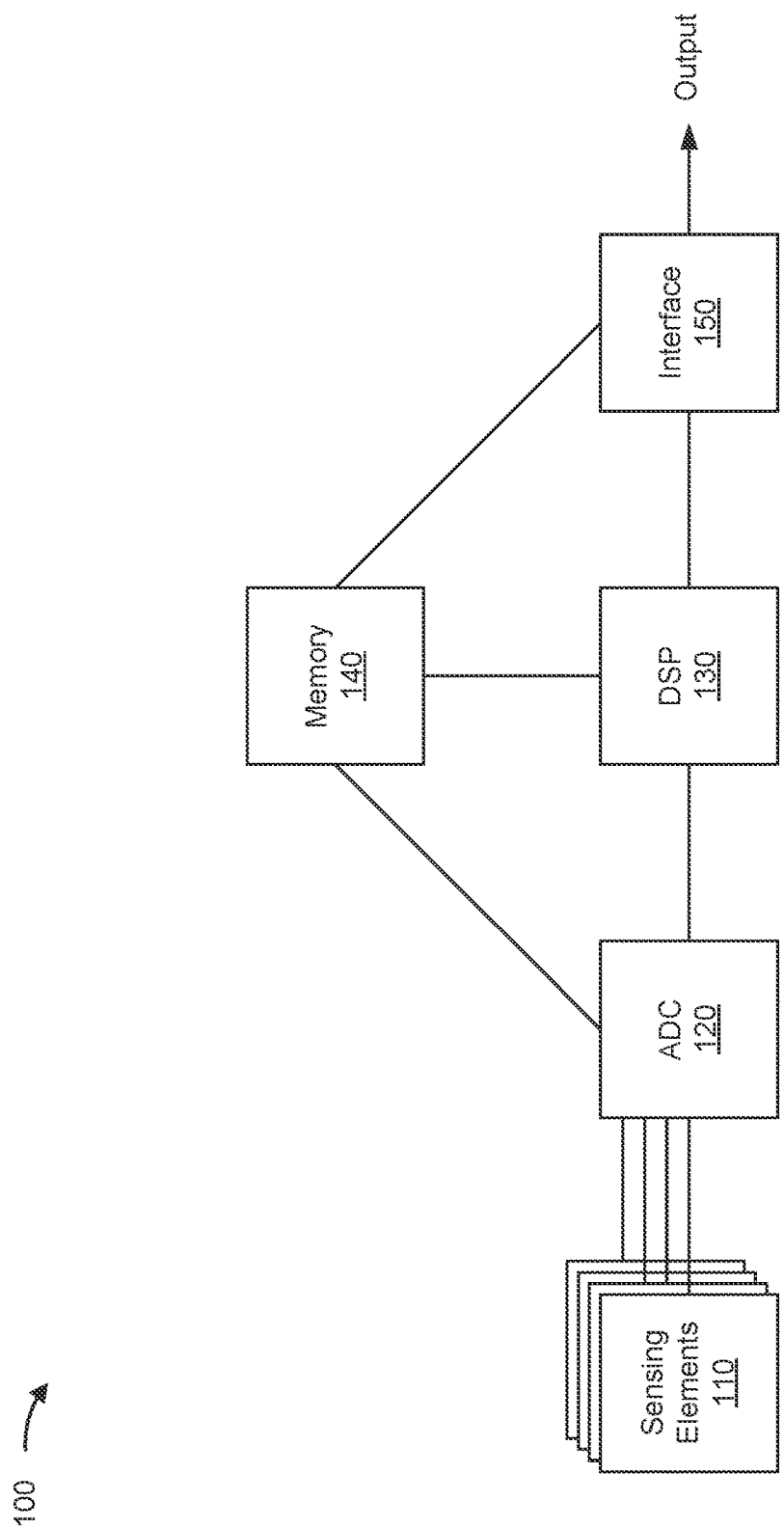
FIG. 1 is a diagram of an example magnetic field sensor according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, an approximate signal value may practically have a signal value within 5% of the approximate signal value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

"Sensor" may refer to a component which converts a property to be measured to an electric signal (e.g., a current signal or a voltage signal). The property to be measured may, for example, comprise a magnetic field, an electric field, an electromagnetic wave (e.g., a radio wave), a pressure, a force, a current, or a voltage, but is not limited thereto. For instance, it will be appreciated that there are various sensor techniques for measuring a current flowing through a conductor or a position of an object in connection with a magnetic field, as will be described below. For example, a system may include a current-carrying conductor that carries a current to be measured. A magnetic field sensor detects a magnetic field created by the current and generates a sensor signal that is proportional to the magnetic field. Thus, the sensor signal is a measure for the current.

For various applications, a sensor used should be matched to a signal range of the property to be measured. For example, a sensitivity of the sensor should be matched to a signal range of the property to be measured. For a current sensor, the sensitivity of the current sensor should be matched to a signal range of the current to be measured (e.g., an amplitude range of the current). Matching a sensitivity of the sensor to the signal range can be a crucial task in the system design and should often be considered to achieve a desired scaling of the property to be measured to a sensor signal range in order to achieve low noise performance and optimal use of connected analog-to-digital converters (ADCs) and/or connected amplifiers. For example, if the sensor is too sensitive (e.g., sensitivity is too high) relative to the signal range of the property to be measured, a sensor signal may be clipped based on a supply voltage, a processing range of a signal processing component (e.g., input signal ranges of an ADC or amplifier), or a saturation. On the other hand, if the sensor is not sensitive enough (e.g., sensitivity is too low) relative to the signal range of the property to be measured, a sensor signal may be too small to be processed and/or may not be sufficiently distinguishable from interference or noise.

Scaling of a signal may be done in a couple of ways. A first approach could include a sensor designed for one specific signal range of the property to be measured. While the first approach may provide a sensor that is tailored to a specific application, a disadvantage of the first approach is that the sensor is not operable for other applications. Therefore, under the first approach, a different sensor chip would be needed for each application, which would result in higher manufacturing costs and possibly impracticable design choices.

On the other hand, a second approach could include a range selection switch that is configured to select a gain for a signal path according to a specific signal range of the property to be measured. The second approach provides an advantage that the gain can be configured for different signal ranges. However, a disadvantage of the second approach may be that the matching between the sensitivity of the sensor and the signal range of the property to be measured is still not achieved or optimized. Another disadvantage of the second approach may be that, when noise or interference is present, the gain for the signal path also amplifies the noise or the interference, which results in lower signal-to-noise ratios (SNRs), a need for more complex signal processing (leading to higher costs), and/or unusable signals.

Accordingly, some implementations disclosed herein are directed to a current sensor having multiple sets of sensor bridges that have different sensor pitches in a chip dimension and, depending on a selected signal range, one of the bridges is selected. Each sensor pitch corresponds to a different sensitivity of the current sensor. Thus, the sensitivity of the current sensor can be adjusted by selecting between the multiple sets of sensor bridges according to respective sensor pitches. This configuration has an advantage in that, by varying sensor pitch on one silicon die, different application signal ranges can be supported without introducing an additional gain on the signal paths that may also amplify interference or noise that may degrade the SNR. This scheme can be achieved without increasing a chip size of the current sensor. Furthermore, differential signals may be generated through use of the sensor bridges, which are robust against homogeneous stray magnetic fields.

FIG. 1 is a diagram of an example magnetic field sensor 100 according to one or more implementations. As shown in FIG. 1, the magnetic field sensor 100 may include one or more sensing elements 110 (e.g., one or more magnetic field sensing elements), an analog-to-digital convertor (ADC) 120, a digital signal processor (DSP) 130, a memory element 140, and an interface 150.

The magnetic field sensor 100 may be a semiconductor chip (e.g., a sensor chip) that includes the one or more sensing elements 110 that measure or otherwise sense one or more characteristics of a magnetic field (e.g., an amount of magnetic field flux density, a field strength, a field angle, a field direction, a field orientation, etc.) and provide a sensor signal corresponding to the sensed characteristics of the magnetic field. For example, a sensing element 110 may be configured to generate a sensor signal (e.g., a voltage) in response to one or more magnetic fields impinging on the sensing element 110. Thus, the sensor signal is indicative of a magnitude and/or a field orientation of at least one magnetic field impinging on the sensing element 110. The semiconductor chip may further include sensor circuitry for processing and outputting one or more sensor signals generated by the one or more sensing elements 110. In some implementations, the sensing elements 110 may be distributed on two or more semiconductor chips.

The magnetic field may be produced by a magnet, a current-carrying conductor (e.g., a wire, a lead frame, or a busbar), the Earth, or another magnetic field source. A sensing element 110 has a "sensitivity axis" or "sensing axis." The sensing element is sensitive to a magnetic field component of a magnetic field that is projected onto or aligned with the sensitivity axis. Moreover, a sensing element 110 is substantially insensitive to magnetic field components of a magnetic field that are not projected onto or aligned with the sensitivity axis. A magnetic field component may be, for example, an x-magnetic field component Bx, a y-magnetic field component By, or a z-magnetic field component Bz. In the examples described herein, the x-magnetic field component Bx and the y-magnetic field component By are aligned in-plane to the semiconductor chip and the z-magnetic field component Bz is aligned out-of-plane to the semiconductor chip. Accordingly, the x-magnetic field component Bx and the y-magnetic field component By may be referred to as "in-plane" magnetic field components that are aligned parallel to a chip plane (e.g., a chip surface) of the semiconductor chip. In contrast, the z-magnetic field component Bz may be referred to as an "out-of-plane" magnetic field component that extends out of the chip plane (e.g., a chip surface) of the semiconductor chip. For example, the z-magnetic field component Bz extends perpendicular to the chip plane.

In some implementations, the magnetic field sensor 100 includes multiple sensing elements 110 that are sensitive in two or more different directions. For example, the magnetic field sensor 100 may include a first sensing element configured to sense a first magnetic field component (e.g., the x-magnetic field component By), a second sensing element configured to sense a second magnetic field component (e.g., the y-magnetic field component By), and a third Hall-based sensing element configured to sense a third magnetic field component (e.g., the z-magnetic field component Bz). That is, in some implementations, the magnetic field sensor 100 may be a 2D magnetic field sensor or a 3D magnetic field sensor that is configured to sense the magnetic field in multiple dimensions.

The sensing elements 110 may include one or more magnetoresistive-based sensing elements (e.g., magnetoresistive sensing elements) or one or more Hall-based sensing elements (e.g., Hall sensing elements). In some embodiments, the sensing elements 110 may include both one or more magnetoresistive sensing elements and one or more Hall sensing elements.

Magnetoresistance is a property of a magnetoresistive material (e.g., nickel-iron (NiFe)) to change a value of its electrical resistance when a magnetic field is applied to the magnetoresistive material. Thus, the electrical resistance of the magnetoresistive material may depend on a strength and/or a direction of the magnetic field present at the magnetoresistive material. Some examples of various magnetoresistive effects are giant magneto-resistance (GMR), which is a quantum mechanical magnetoresistance effect observed in thin-film structures composed of alternating ferromagnetic and non-magnetic conductive layers; tunnel magneto-resistance (TMR), which is a magnetoresistive effect that occurs in a magnetic tunnel junction (MTJ), which is a component including two ferromagnets separated by a thin insulator; or anisotropic magneto-resistance (AMR), which is a property of a material in which a dependence of electrical resistance on an angle between a direction of electric current and a direction of magnetization is observed. For example, in the case of AMR sensors, a resistance for an AMR sensing element changes according to a square of a sine of an angle of the magnetic field component projected on the sensitivity axis of the ARM sensing element.

The various magnetoresistive effects are commonly abbreviated as xMR, where the "x" acts as a placeholder for the various magnetoresistive effects. xMR sensors can detect the field orientation of an applied magnetic field by measuring sine and cosine angle components with monolithically integrated magnetoresistive sensing elements.

Magnetoresistive sensing elements of such xMR sensors typically include a plurality of layers, of which at least one layer is a reference layer with a reference magnetization (e.g., a reference direction). The reference magnetization provides a sensing direction that defines the sensitivity axis of a magnetoresistive sensing element. This generally means that the sensitivity axis of the magnetoresistive sensing element is parallel to the chip plane defined by a main surface of the semiconductor chip in which the magnetoresistive sensing element is integrated. As a result, a magnetoresistive sensing element is sensitive to the magnetic field component that extends parallel to, or in-plane with, the main surface of the semiconductor chip. Accordingly, if a magnetic field component points exactly in a same direction with respect to the reference direction, a resistance of the magnetoresistive sensing element is at a maximum and, if the magnetic field component points exactly in the opposite direction with respect to the reference direction, the resistance of the magnetoresistive sensing element is at a minimum.

As a result, the resistance or a voltage drop across the magnetoresistive sensing element resulting from the resistance is proportional to the magnetic field and can be used as the sensor signal of the magnetoresistive sensing element. Moreover, in some implementations, an xMR sensor includes a plurality of magnetoresistive sensing elements, which may have the same or different reference magnetizations.

A Hall sensing element is a transducer that varies an output voltage (e.g., a Hall voltage) in response to a magnetic field. The Hall sensing element may be, for example, a Hall plate through which a current is conducted. The output voltage of the Hall sensing element is based on a Hall effect which makes use of a Lorentz force. The Lorentz force deflects moving charges in a presence of the magnetic field which is perpendicular to a current flow through the Hall sensing element (e.g., a Hall plate). Thereby, the sensing element can be a thin piece of semiconductor material or metal. The deflection causes a charge separation, which causes a Hall electrical field. This Hall electrical field acts on the charge in an opposite direction with regard to the Lorentz force. Both forces balance each other and create a potential difference perpendicular to a direction of current flow. The potential difference can be measured as the Hall voltage and varies in a linear relationship with the magnetic field.

There are generally two types of Hall sensing elements, including vertical Hall sensing elements and lateral Hall sensing elements. A vertical Hall sensing element (e.g., a vertical Hall plate) is constructed perpendicular to the chip plane defined by the main surface of the semiconductor chip. In particular, the vertical Hall sensing element may be a conductive plate having a sensor plane that extends "vertically" from the main surface of the semiconductor chip into a chip body of the semiconductor chip. The sensitivity axis of the vertical Hall sensing element is perpendicular to the sensor plane. This generally means that the vertical Hall sensing element is sensitive to the magnetic field component that extends parallel to, or in-plane with, the main surface of the semiconductor chip in which the vertical Hall sensing element is integrated. For the vertical Hall sensing element, a voltage value may be output according to a magnetic field flux density in the direction of its sensitivity axis.

On the other hand, a lateral (planar) Hall sensing element (e.g., a lateral Hall plate) is constructed with a sensor plane that is parallel to the chip plane defined by the main surface of the semiconductor chip. In particular, the lateral Hall sensing element may be a conductive plate having a sensor plane that extends "laterally" along or parallel to the main surface of the semiconductor chip. Since the sensitivity axis of the lateral Hall sensing element is perpendicular to the sensor plane, this generally means that the lateral Hall sensing element is sensitive to magnetic fields vertical, or out-of-plane, to the main surface of the semiconductor chip. For the lateral Hall sensing element, a voltage value may be output according to the magnetic field flux density in the direction of its sensitivity axis.

Accordingly, magnetoresistive sensing elements and vertical Hall sensing elements may be used to measure magnetic fields parallel to the chip plane of the magnetic field sensor 100, and lateral Hall sensing elements may be used to measure magnetic fields perpendicular to the chip plane of the magnetic field sensor 100. Two or more sensing elements and corresponding sensor circuitry may be accommodated (e.g., integrated) in a same semiconductor chip. The sensor circuitry may be referred to as a signal processing circuit and/or a signal conditioning circuit that receives one or more signals (e.g., sensor signals) from one or more sensing elements in the form of raw measurement data, and derives, from the one or more signals, a measurement signal that represents the magnetic field. For example, the sensor circuitry may be configured to condition and amplify the sensor signal of one or more sensing elements 110 via signal processing and/or conditioning.

In some implementations, the sensor circuitry may be configured to combine two or more sensor signals (e.g., by addition, subtraction, or superimposition) to generate a combined sensor signal. For example, a differential signal is one type of combined sensor signal that is representative of a difference between two signals. In some cases, the sensor circuitry may generate a differential sensor signal from the signals generated by two or more sensing elements 110 having a same sensitivity axis (e.g., two sensing elements 110 sensitive to a same magnetic field component) using differential circuitry configured to differentially combine the signals. Sensing elements electrically connected in a half-bridge configuration or in a full-bridge configuration are examples of differential circuitry that may be used to generate differential sensor signals. Additionally, or alternatively, differential circuitry may include a differential amplifier, an adder, a subtractor, a combiner, logic circuitry, and/or a processor (e.g., a processor that applies differential calculus) to differentially combine the signals to generate a differential sensor signal. A differential measurement signal may provide a robustness to homogeneous external stray magnetic fields.

Notably, the above-described examples of sensing elements 110 are provided for illustrative purposes and, in practice, the sensing elements 110 may include any type of magnetic field sensing element capable of sensing a characteristic of a magnetic field and enabling a sensor signal to be provided to sensor circuitry.

The ADC 120 may include an analog-to-digital converter that converts an analog signal from one or more sensing elements 110 to a digital signal. For example, the ADC 120 may convert analog signals, received from the set of sensing elements 110, into digital signals (e.g., digital samples) to be processed by DSP 130. The ADC 120 may provide the digital signals to DSP 130. In some implementations, magnetic field sensor 100 may include one or more ADCs 120. For example, different ADCs 120 may be configured to receive analog signals from different sets of sensing elements 110.

The DSP 130 may include a digital signal processing device or a collection of digital signal processing devices. In some implementations, the DSP 130 may receive digital signals from the ADC 120 and may process the digital signals to form output signals (e.g., destined for a controller), such as an output signal that conveys sensor data, as described elsewhere herein. In some implementations, the output signals may be referred to as measurement signals.

The memory element 140 may include a read-only memory (ROM) (e.g., an EEPROM), a random-access memory (RAM), and/or another type of dynamic or static storage device (e.g., a flash memory, a magnetic memory, an optical memory, etc.) that stores information and/or instructions for use by magnetic field sensor 100. In some implementations, the memory element 140 may store information associated with processing performed by DSP 130. Additionally, or alternatively, the memory element 140 may store configurational values or parameters for the one or more sensing elements 110 and/or information for one or more other components of magnetic field sensor 100, such as the ADC 120 or the interface 150.

The interface 150 may include an interface via which magnetic field sensor 100 may receive and/or provide information from and/or to another device in a system, such as a controller. For example, the interface 150 may provide the output signal, determined or otherwise generated by DSP 130, to the controller, and may further receive information from the controller. In some implementations, the interface 150 may be a communication interface that receives the output signals from the DSP 130 and provides the output signals as communication signals according to a communication protocol, which may include transmitting the output signals as the communication signals or generating the communication signals based on the output signals.

As indicated above, FIG. 1 is provided merely as an example. Other examples are possible and may differ from what was described with regard to FIG. 1. The number and arrangement of components shown in FIG. 1 are provided as an example. In practice, the magnetic field sensor 100 may include additional components, fewer components, different components, or differently arranged components than those shown in FIG. 1. Two or more components shown in FIG. 1 may be implemented within a single component, or a single component shown in FIG. 1 may be implemented as multiple, distributed components. Additionally, or alternatively, a set of components (e.g., one or more components) of the magnetic field sensor 100 may perform one or more functions described as being performed by another set of components of the magnetic field sensor 100.

Figure 2A:
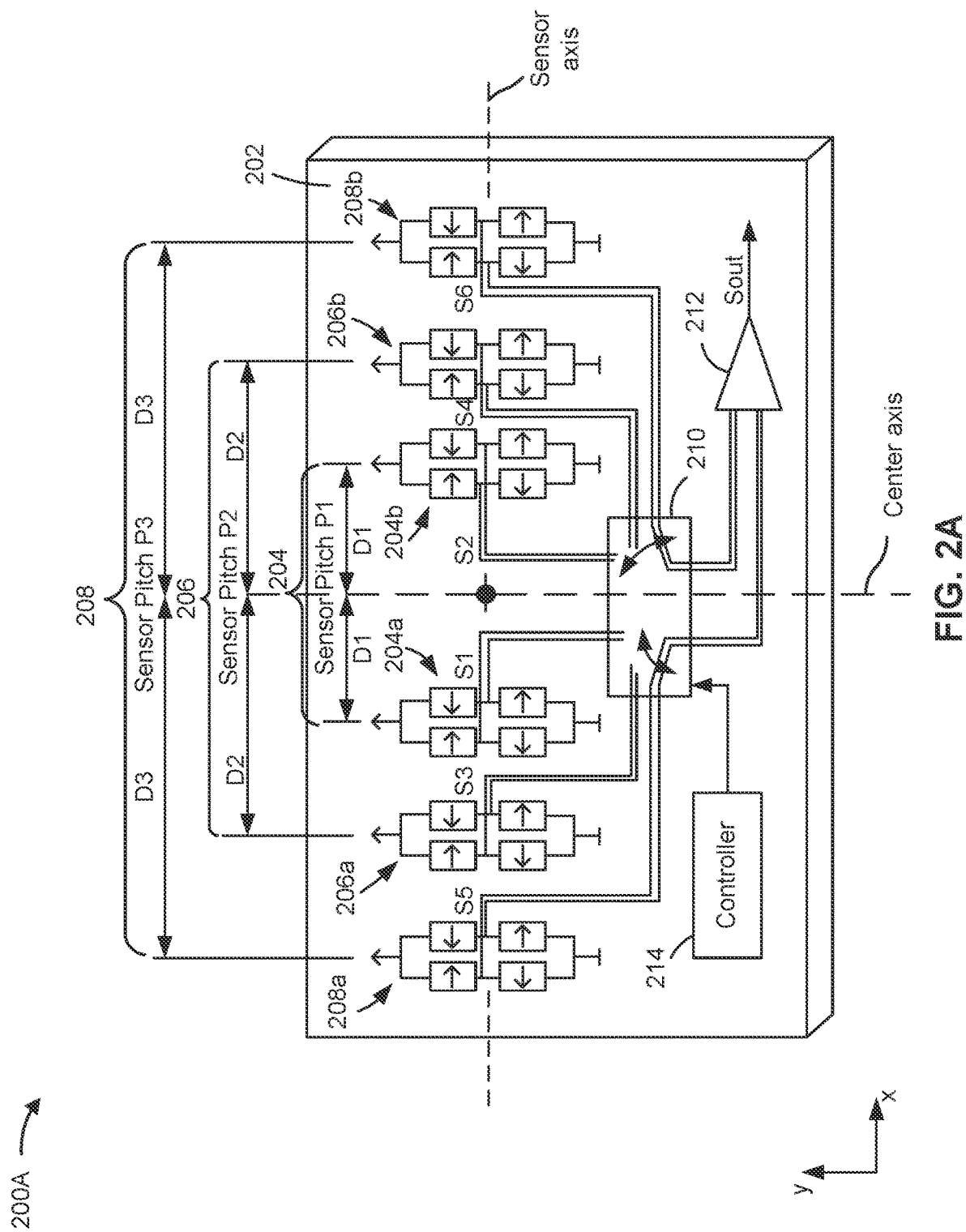
FIG. 2A illustrates a current sensor according to one or more implementations.

FIG. 2A illustrates a current sensor 200A according to one or more implementations. The current sensor 200A may be a semiconductor chip that includes a chip surface 202 that defines a chip plane. The current sensor 200A may be a magnetic field sensor, as similarly described in connection with FIG. 1, that includes a plurality of magnetic field sensor circuits, with each magnetic field sensor circuit of the plurality of magnetic field sensor circuits comprising a pair of sensor bridges. Each of the sensor bridges is a full bridge (e.g., a Wheatstone bridge). In other words, each of the sensor bridges includes at least four magnetic field sensing elements electrically coupled in a full-bridge circuit configuration. The magnetic field sensing elements may be arranged on the chip surface 202, embedded at the chip surface 202, and/or arranged to extend into the semiconductor chip from the chip surface 202. In this example, the plurality of magnetic field sensor circuits includes a first magnetic field sensor circuit 204, a second magnetic field sensor circuit 206, and a third magnetic field sensor circuit 208. While three magnetic field sensor circuits are provided in this example, it will be appreciated that some implementations may include only two magnetic field sensor circuits while some other implementations may include four or more magnetic field sensor circuits.

The first magnetic field sensor circuit 204 includes a first plurality of sensor bridges including a first sensor bridge 204a configured to generate a first pair of differential sensor signals S1 and a second sensor bridge 204b configured to generate a second pair of differential sensor signals S2. The first sensor bridge 204a and the second sensor bridge 204b are laterally separated along a sensor axis (e.g., an x-axis) by a first sensor pitch P1. The first sensor pitch P1 may be defined as a distance between a geometric center of the first sensor bridge 204a and a geometric center of the second sensor bridge 204b along the sensor axis. The first magnetic field sensor circuit 204 has a first sensor sensitivity that corresponds to the first sensor pitch P1.

In general, a sensor sensitivity indicates how much an output of a sensor changes when an input quantity it measures changes. In addition, a sensor sensitivity defines a magnitude of the output of the sensor for a given magnitude of an input quantity. For example, for a given magnitude of a magnetic field, a sensor with a lower sensor sensitivity will output a smaller sensor signal (e.g., in magnitude) than a sensor signal produced by a different sensor with a higher sensor sensitivity. The sensor sensitivity may correspond to a sensor circuit as a whole or to the individual sensing elements. For example, the sensing elements may be manufactured with a same magnitude of sensitivity or different magnitudes of sensitivity. If the magnitude of sensitivity for a plurality of sensing elements is the same, the sensing elements generate sensor signals (e.g., voltages) of substantially equal magnitudes when exposed to a same strength of magnetic field.

The sensor sensitivity of a magnetic field sensor circuit (e.g., the first magnetic field sensor circuit 204, the second magnetic field sensor circuit 206, or the third magnetic field sensor circuit 208) increases with increasing sensor pitch and decreases with decreasing sensor pitch. Thus, the sensor sensitivity and the sensor pitch have a direct correspondence to each other. Lower sensor sensitivities may be better suited for sensing magnetic fields with higher amplitudes in order to help ensure that the sensor signals produced are within a processing range of a signal processing circuit. Otherwise, the sensor signals produced outside of the processing range of a signal processing circuit may become clipped. In contrast, higher sensor sensitivities may be better suited for magnetic fields with lower amplitudes in order to ensure that the sensor signals produced are distinguishable from noise and interference. As a result, a gain of the sensor signals is controlled by the sensor sensitivity, with higher gains achieved by higher sensor sensitivities and lower gains achieved by lower sensor sensitivities.

Because the quantity of the magnetic field is proportional to an amount of current flowing through a conductor, the sensor sensitivity may be matched to a range of magnitudes of a current to be measured. For example, for larger currents, a lower sensor sensitivity may be selected among different sensor sensitivities. In contrast, for smaller currents, a higher sensor sensitivity may be selected among different sensor sensitivities.

The first sensor bridge 204a comprises a first plurality of magnetic field sensing elements electrically coupled in a first full-bridge circuit configuration. The first pair of differential sensor signals S1 is representative of a differential output signal of the first sensor bridge 204a, which is provided by two output terminals of the first sensor bridge 204a. Arrows are used to indicate a sensing direction for each of the magnetic field sensing elements corresponding to a respective sensitivity axis. Accordingly, the sensitivity axis of each magnetic field sensing element of the first plurality of magnetic field sensing elements of the first sensor bridge 204a is aligned with the sensor axis in order to sense, for example, an x-magnetic field component Bx of a magnetic field. In other words, the first plurality of magnetic field sensing elements of the first sensor bridge 204a may be xMR sensing elements or vertical Hall sensing elements that are sensitive to an in-plane magnetic field component of the magnetic field.

The second sensor bridge 204b comprises a second plurality of magnetic field sensing elements electrically coupled in a second full-bridge circuit configuration. The second pair of differential sensor signals S2 is representative of a differential output signal of the second sensor bridge 204b, which is provided by two output terminals of the second sensor bridge 204b. Similar to the first plurality of magnetic field sensing elements of the first sensor bridge 204a, the second plurality of magnetic field sensing elements of the second sensor bridge 204b are sensitive to the in-plane magnetic field component (e.g., the x-magnetic field component Bx) of the magnetic field.

The second magnetic field sensor circuit 206 includes a second plurality of sensor bridges including a third sensor bridge 206a configured to generate a third pair of differential sensor signals S3 and a fourth sensor bridge 206b configured to generate a fourth pair of differential sensor signals S4. The third sensor bridge 206a and the fourth sensor bridge 206b are laterally separated along the sensor axis (e.g., the x-axis) by a second sensor pitch P2 that is larger than the first sensor pitch P1. The second sensor pitch P2 may be defined as a distance between a geometric center of the third sensor bridge 206a and a geometric center of the fourth sensor bridge 206b along the sensor axis. Furthermore, the second magnetic field sensor circuit 206 has a second sensor sensitivity that corresponds to the second sensor pitch P2. Accordingly, the second sensor sensitivity of the second magnetic field sensor circuit 206 is higher than the first sensor sensitivity of the first magnetic field sensor circuit 204.

The third sensor bridge 206a comprises a third plurality of magnetic field sensing elements electrically coupled in a third full-bridge circuit configuration. The third pair of differential sensor signals S3 is representative of a differential output signal of the third sensor bridge 206a, which is provided by two output terminals of the third sensor bridge 206a. Similar to the first plurality of magnetic field sensing elements of the first sensor bridge 204a, the third plurality of magnetic field sensing elements of the third sensor bridge 206a are sensitive to the in-plane magnetic field component (e.g., the x-magnetic field component Bx) of the magnetic field.

The fourth sensor bridge 206b comprises a fourth plurality of magnetic field sensing elements electrically coupled in a fourth full-bridge circuit configuration. The fourth pair of differential sensor signals S4 is representative of a differential output signal of the fourth sensor bridge 206b, which is provided by two output terminals of the fourth sensor bridge 206b. Similar to the first plurality of magnetic field sensing elements of the first sensor bridge 204a, the fourth plurality of magnetic field sensing elements of the fourth sensor bridge 206b are sensitive to the in-plane magnetic field component (e.g., the x-magnetic field component Bx) of the magnetic field.

The third magnetic field sensor circuit 208 includes a third plurality of sensor bridges including a fifth sensor bridge 208a configured to generate a fifth pair of differential sensor signals S5 and a sixth sensor bridge 208b configured to generate a sixth pair of differential sensor signals S6. The fifth sensor bridge 208a and the sixth sensor bridge 208b are laterally separated along the sensor axis (e.g., the x-axis) by a third sensor pitch P3 that is larger than the second sensor pitch P2. The third sensor pitch P3 may be defined as a distance between a geometric center of the fifth sensor bridge 208a and a geometric center of the sixth sensor bridge 208b along the sensor axis. Furthermore, the third magnetic field sensor circuit 208 has a third sensor sensitivity that corresponds to the third sensor pitch P3. Accordingly, the third sensor sensitivity of the third magnetic field sensor circuit 208 is higher than the first sensor sensitivity of the first magnetic field sensor circuit 204 and the second sensor sensitivity of the second magnetic field sensor circuit 206.

The fifth sensor bridge 208a comprises a fifth plurality of magnetic field sensing elements electrically coupled in a fifth full-bridge circuit configuration. The fifth pair of differential sensor signals S5 is representative of a differential output signal of the fifth sensor bridge 208a, which is provided by two output terminals of the fifth sensor bridge 208a. Similar to the first plurality of magnetic field sensing elements of the first sensor bridge 204a, the fifth plurality of magnetic field sensing elements of the fifth sensor bridge 208a are sensitive to the in-plane magnetic field component (e.g., the x-magnetic field component Bx) of the magnetic field.

The sixth sensor bridge 208b comprises a sixth plurality of magnetic field sensing elements electrically coupled in a sixth full-bridge circuit configuration. The sixth pair of differential sensor signals S6 is representative of a differential output signal of the sixth sensor bridge 208b, which is provided by two output terminals of the sixth sensor bridge 208b. Similar to the first plurality of magnetic field sensing elements of the first sensor bridge 204a, the sixth plurality of magnetic field sensing elements of the sixth sensor bridge 208b are sensitive to the in-plane magnetic field component (e.g., the x-magnetic field component Bx) of the magnetic field.

The current sensor 200A may include a selector switch 210 configurable in a plurality of switch states. Because the sensor bridges continuously sense the magnetic field and continuously output the pairs of differential signals, the selector switch 210 may be configured to simultaneously receive the first pair of differential sensor signals S1, the second pair of differential sensor signals S2, the third pair of differential sensor signals S3, the fourth pair of differential sensor signals S4, the fifth pair of differential sensor signals S5, and the sixth pair of differential sensor signals S6. The selector switch 210 may be configured to output the first pair of differential sensor signals S1 and the second pair of differential sensor signals S2, if configured in a first switch state of the plurality of switch states. Alternatively, the selector switch 210 may be configured to output the third pair of differential sensor signals S3 and the fourth pair of differential sensor signals S4, if configured in a second switch state of the plurality of switch states. Alternatively, the selector switch 210 may be configured to output the fifth pair of differential sensor signals S5 and the sixth pair of differential sensor signals S6, if configured in a third switch state of the plurality of switch states. Accordingly, the selector switch 210 may be used to select between the first magnetic field sensor circuit 204, the second magnetic field sensor circuit 206, and the third magnetic field sensor circuit 208. In particular, by selecting one of the magnetic field sensor circuits, the selector switch 210 may be used to select between different sensor sensitivities, including the first sensor sensitivity, the second sensor sensitivity, and the third sensor sensitivity, in order to match selected sensor sensitivity to a range of magnitudes of a magnetic field to be measured.

The current sensor 200A may include a differential circuit 212 that is coupled to the outputs of the selector switch 210. The differential circuit 212 may be configured to receive the differential sensor signals selected by the selector switch 210 for output. The differential circuit 212 may be configured to generate an output signal Sout that represents a difference between the two differential signals received from the selector switch 210. For example, if the selector switch 210 is configured in the first switch state, the differential circuit 212 may be configured to receive the first pair of differential sensor signals S1 and the second pair of differential sensor signals S2, and generate the sensor output signal Sout as a first output signal representative of a first difference between the first pair of differential sensor signals S1 and the second pair of differential sensor signals S2. Alternatively, if the selector switch 210 is configured in the second switch state, the differential circuit 212 may be configured to receive the third pair of differential sensor signals S3 and the fourth pair of differential sensor signals S4, and generate the sensor output signal Sout as a second output signal representative of a second difference between the third pair of differential sensor signals S3 and the fourth pair of differential sensor signals S4. Alternatively, if the selector switch 210 is configured in the third switch state, the differential circuit 212 may be configured to receive the fifth pair of differential sensor signals S5 and the sixth pair of differential sensor signals S6 and generate the sensor output signal Sout as a third output signal representative of a third difference between the fifth pair of differential sensor signals S5 and the sixth pair of differential sensor signals S6. The sensor output signal Sout may be provided to a component of a signal processing chain, such as an ADC (e.g., ADC 120).

In some implementations, the differential circuit 212 may be a double differential amplifier that is configured to, depending on the switch state of the selector switch 210, receive the first pair of differential sensor signals S1 and generate a first measurement signal representative of a difference between the first pair of differential sensor signals, receive the second pair of differential sensor signals S2 and generate a second measurement signal representative of a difference between the second pair of differential sensor signals, receive the third pair of differential sensor signals S3 and generate a third measurement signal representative of a difference between the third pair of differential sensor signals, receive the fourth pair of differential sensor signals S4 and generate a fourth measurement signal representative of a difference between the fourth pair of differential sensor signals, generate the first output signal based on a difference between the first measurement signal and the second measurement signal, and generate the second output signal based on a difference between the third measurement signal and the fourth measurement signal. Similar functionality of the double differential amplifier may be extended to the third magnetic field sensor circuit 208 or to additional magnetic field sensor circuits.

Figure 2B:
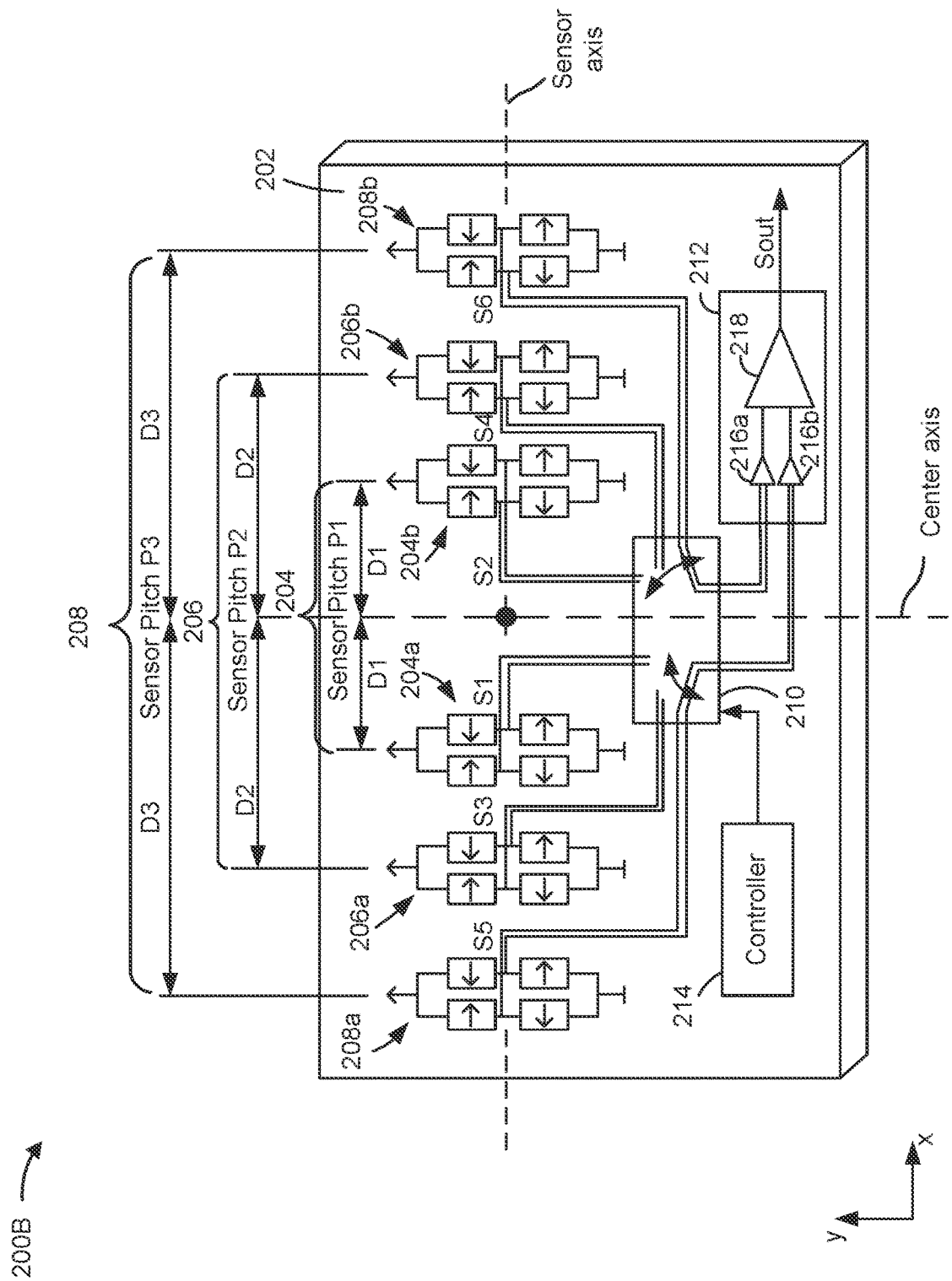
FIG. 2B illustrates a current sensor according to one or more implementations.
Figure 2C:
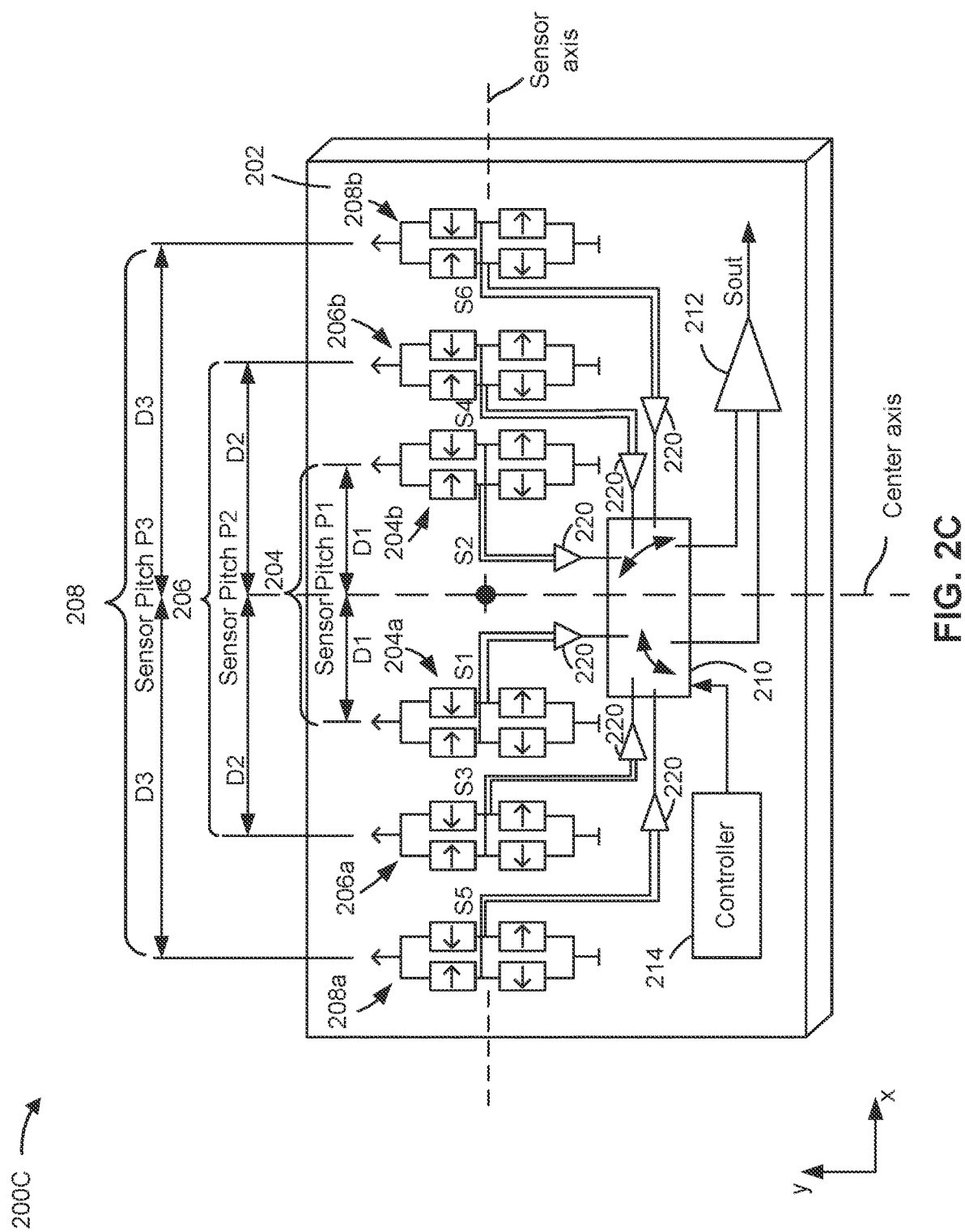
FIG. 2C illustrates a current sensor according to one or more implementations.

In some implementations, the differential circuit 212 may be realized by two or more stages of differential amplifiers, as shown in FIGS. 2B and 2C.

It is to be noted that the first sensor sensitivity of the first magnetic field sensor circuit 204 may be matched to a first signal range to be measured, the second sensor sensitivity of the second magnetic field sensor circuit 206 may be matched to a second signal range to be measured, and the third sensor sensitivity of the third magnetic field sensor circuit 208 may be matched to a third signal range to be measured. For example, the first sensor sensitivity may be matched to a first range of magnetic flux densities, the second sensor sensitivity may be matched to a second range of magnetic flux densities, and the third sensor sensitivity may be matched to a third range of magnetic flux densities. The first range of magnetic flux densities may be defined by a first maximum flux density, the second range of magnetic flux densities may be defined by a second maximum flux density that is less than the first maximum flux density, and the third range of magnetic flux densities may be defined by a third maximum flux density that is less than the second maximum flux density. The selector switch 210 may be configured to select the sensor sensitivity that is best suited for the magnitude of the magnetic field to be measured by selecting sensor signals from the first magnetic field sensor circuit 204, the second magnetic field sensor circuit 206, and the third magnetic field sensor circuit 208 for output to the differential circuit 212. Therefore, the selector switch 210 enables the sensor sensitivity to be matched to a signal range (e.g., amplitude range) of the magnetic field to prevent clipping or degradation to the SNR of the output signal Sout.

The current sensor 200A may be configured to measure different currents, having different magnitudes, by controlling the switch state of the selector switch 210. For example, the differential circuit may be configured to generate the output signal Sout as the first output signal based on a first magnetic field produced by a first current, generate the output signal Sout as the second output signal based on a second magnetic field produced by a second current, or generate the output signal Sout as the third output signal based on a third magnetic field produced by a third current, where the first current has a first maximum amplitude, the second current has a second maximum amplitude that is smaller than the first maximum amplitude, and the third current has a third maximum amplitude that is smaller than the second maximum amplitude.

The current sensor 200A may include a controller 214 that is configured to set the selector switch 210 into one of the plurality of switch states based on the signal range (e.g., amplitude range) of the magnetic field intended to be measured. For example, the controller 214 may be configured to set the selector switch 210 into the first switch state for measuring the first current, set the selector switch 210 into the second switch state for measuring the second current, and set the selector switch 210 into the third switch state for measuring the third current.

In some implementations, the differential circuit 212 may have a fixed gain, wherein the differential circuit 212 is configured to generate the first output signal, the second output signal, or the thirst output signal as the output signal Sout based on the fixed gain. Instead, a variable gain is achieved by selecting among the different sensor sensitivities provided by the first magnetic field sensor circuit 204, the second magnetic field sensor circuit 206, and the third magnetic field sensor circuit 208. As a result, any noise or interference that may be present may be amplified by the fixed gain but is not further amplified by the variable gain that is achieved by varying the switch state of the selector switch 210. As a result, the SNR can be maintained substantially constant.

Manufacturing the first plurality of magnetic field sensing elements, the second plurality of magnetic field sensing elements, the third plurality of magnetic field sensing elements, the fourth plurality of magnetic field sensing elements, the fifth plurality of magnetic field sensing elements, and the sixth plurality of magnetic field sensing elements may be performed in a way to produce these sensing elements to have substantially a same magnitude of sensitivity to a same magnetic field component aligned with the sensor axis may. By doing so, the production of the sensing elements may be simplified, since the sensing elements could be produced in a same manufacturing step (e.g., a same magnetization step). In contrast, these sensing elements could be manufactured with different magnitudes of sensitivity to achieve higher variation in overall sensor sensitivity. However, producing these sensing elements with different magnitudes of sensitivity introduces higher complexity in the production process, since additional manufacturing steps are used to achieve different magnitudes of sensitivity.

The first magnetic field sensor circuit 204, the second magnetic field sensor circuit 206, and the third magnetic field sensor circuit 208 may each be symmetric about a center axis (e.g., a y-axis) that is perpendicular to the sensor axis (e.g., the x-axis). For example, the first sensor bridge 204a and the second sensor bridge 204b may be differentially offset from the center axis along the sensor axis by a first distance D1, the third sensor bridge 206a and the fourth sensor bridge 206b may be differentially offset from the center axis along the sensor axis by a second distance D2 that is greater than the first distance D1, and the fifth sensor bridge 208a and the sixth sensor bridge 208b may be differentially offset from the center axis along the sensor axis by a third distance D3 that is greater than the second distance D2. The first sensor bridge 204a, the third sensor bridge 206a, and the fifth sensor bridge 208a are positioned on a first side of the center axis, whereas the second sensor bridge 204b, the fourth sensor bridge 206b, and the sixth sensor bridge 208b are positioned on a second side of the center axis.

As a result, the first sensor bridge 204a is arranged substantially symmetric to the second sensor bridge 204b about the center axis, wherein the first sensor bridge 204a is laterally separated from the center axis in a first direction along the sensor axis by the first distance D1, and wherein the second sensor bridge 204b is laterally separated from the center axis in a second direction, opposite to the first direction, along the sensor axis by the first distance D1. Additionally, the third sensor bridge 206a is arranged substantially symmetric to the fourth sensor bridge 206b about the center axis, wherein the third sensor bridge 206a is laterally separated from the center axis in the first direction along the sensor axis by the second distance D2, and wherein the fourth sensor bridge 206b is laterally separated from the center axis in the second direction along the sensor axis by the second distance D2. Additionally, the fifth sensor bridge 208a is arranged substantially symmetric to the sixth sensor bridge 208b about the center axis, wherein the fifth sensor bridge 208a is laterally separated from the center axis in the first direction along the sensor axis by the third distance D3, and wherein the sixth sensor bridge 208b is laterally separated from the center axis in the second direction along the sensor axis by the third distance D3.

As indicated above, FIG. 2A is provided merely as an example. Other examples are possible and may differ from what was described with regard to FIG. 2A. The number and arrangement of components shown in FIG. 2A are provided as an example. In practice, the current sensor 200A may include additional components, fewer components, different components, or differently arranged components than those shown in FIG. 2A. Two or more components shown in FIG. 2A may be implemented within a single component, or a single component shown in FIG. 2A may be implemented as multiple, distributed components. Additionally, or alternatively, a set of components (e.g., one or more components) of the current sensor 200A may perform one or more functions described as being performed by another set of components of the current sensor 200A.

FIG. 2B illustrates a current sensor 200B according to one or more implementations. The current sensor 200B is similar to the current sensor 200A described in connection with FIG. 2A, with the exception that the differential circuit 212 includes two stages of differential amplifiers, including a first stage of differential amplifiers 216 and a second stage of differential amplifiers 218. The first stage of differential amplifiers 216 and the second stage of differential amplifiers 218 perform in a similar manner as described above with respect to the differential circuit 212. For example, the differential circuit 212 may be configured to, while the selector switch 210 is in the first switch state, receive the first pair of differential sensor signals S1 at differential amplifier 216a and generate a first measurement signal representative of a difference between the first pair of differential sensor signals, receive the second pair of differential sensor signals S2 at differential amplifier 216b and generate a second measurement signal representative of a difference between the second pair of differential sensor signals, and generate the first output signal at differential amplifier 218 based on a difference between the first measurement signal and the second measurement signal. The differential circuit 212 may be configured to, while the selector switch 210 is in the second switch state, receive the third pair of differential sensor signals S3 at the differential amplifier 216a and generate a third measurement signal representative of a difference between the third pair of differential sensor signals, receive the fourth pair of differential sensor signals S4 at the differential amplifier 216b and generate a fourth measurement signal representative of a difference between the fourth pair of differential sensor signals, and generate the second output signal at the differential amplifier 218 based on a difference between the third measurement signal and the fourth measurement signal. Similar functionality of the differential circuit 212 may be extended to the third magnetic field sensor circuit 208 or to additional magnetic field sensor circuits.

As indicated above, FIG. 2B is provided merely as an example. Other examples are possible and may differ from what was described with regard to FIG. 2B. The number and arrangement of components shown in FIG. 2B are provided as an example. In practice, the current sensor 200B may include additional components, fewer components, different components, or differently arranged components than those shown in FIG. 2B. Two or more components shown in FIG. 2B may be implemented within a single component, or a single component shown in FIG. 2B may be implemented as multiple, distributed components. Additionally, or alternatively, a set of components (e.g., one or more components) of the current sensor 200B may perform one or more functions described as being performed by another set of components of the current sensor 200B.

FIG. 2C illustrates a current sensor 200C according to one or more implementations. The current sensor 200C is similar to the current sensor 200A described in connection with FIG. 2A, with the exception that the differential circuit 212 is a single stage differential amplifier and an additional stage of differential amplifiers 220 is provided upstream from the selector switch 210. Thus, the differential amplifiers 220 are configured to receive differential outputs from a respective sensor bridge (e.g., the first sensor bridge 204a, the second sensor bridge 204b, the third sensor bridge 206a, the fourth sensor bridge 206b, the fifth sensor bridge 208a, or the sixth sensor bridge 208b), and generate a respective differential sensor signal to be provided to the selector switch 210. As a result, in some implementations, the differential amplifiers 220 may be regarded as part of the magnetic field sensor circuits 204, 206, and 208, respectively. By providing the differential amplifiers 220 upstream from the selector switch 210, a structure of the selector switch 210 may be simplified.

As indicated above, FIG. 2C is provided merely as an example. Other examples are possible and may differ from what was described with regard to FIG. 2C. The number and arrangement of components shown in FIG. 2C are provided as an example. In practice, the current sensor 200C may include additional components, fewer components, different components, or differently arranged components than those shown in FIG. 2C. Two or more components shown in FIG. 2C may be implemented within a single component, or a single component shown in FIG. 2C may be implemented as multiple, distributed components. Additionally, or alternatively, a set of components (e.g., one or more components) of the current sensor 200C may perform one or more functions described as being performed by another set of components of the current sensor 200C.

FIG. 3 illustrates a current sensor arrangement 300 according to one or more implementations. The current sensor arrangement 300 may include a conductor 302 configured to carry a current I which produces a magnetic field and a chip package 304 that includes a current sensor 306 (e.g., a magnetic field sensor chip). The current sensor 306 may be similar to the current sensors 200A, 200B, or 200C described above in connection with FIGS. 2A-2C. Accordingly, the current sensor 306 may include the first sensor bridge 204a, the second sensor bridge 204b, the third sensor bridge 206a, the fourth sensor bridge 206b, the fifth sensor bridge 208a, or the sixth sensor bridge 208b that are differentially spaced with respect to the center axis in the manner described above in connection with FIGS. 2A-2C.

The conductor 302 may be a current rail, a bus bar, or another conductor that carries a current I to be measured. The conductor 302 includes a conductor edge 308 that extends parallel to a current flow direction of the current I. The current sensor 306 is arranged relative to the conductor 302 such that the center axis of the current sensor 306 is substantially centered over the conductor edge 308 of the conductor 302 and extends parallel to the current flow direction of the current I. In other words, the center axis of the current sensor 306 overlaps with the conductor edge 308 of the conductor 302 in the out-of-plane direction of the current sensor 306 (e.g., the z-direction).

The first sensor bridge 204a, the third sensor bridge 206a, and the fifth sensor bridge 208a are laterally displaced from the center axis and the conductor edge 308 in the first direction such that sensing elements of the first sensor bridge 204a, the third sensor bridge 206a, and the fifth sensor bridge 208a overlap with the conductor 302 in the out-of-plane direction. The second sensor bridge 204b, the fourth sensor bridge 206b, and the sixth sensor bridge 208b are laterally displaced from the center axis and the conductor edge 308 in the second direction, opposite to the first direction, such that sensing elements of the second sensor bridge 204b, the fourth sensor bridge 206b, and the sixth sensor bridge 208b do not overlap with the conductor 302 in the out-of-plane direction. Accordingly, each magnetic field sensor circuit of the magnetic field sensor circuits 204, 206, and 208 is arranged to sense a differential magnetic field produced by the current I flowing through the conductor 302.

The number and arrangement of components shown in FIG. 3 are provided as an example. In practice, the current sensor arrangement 300 may include additional components, fewer components, different components, or differently arranged components than those shown in FIG. 3.

Figure 4:
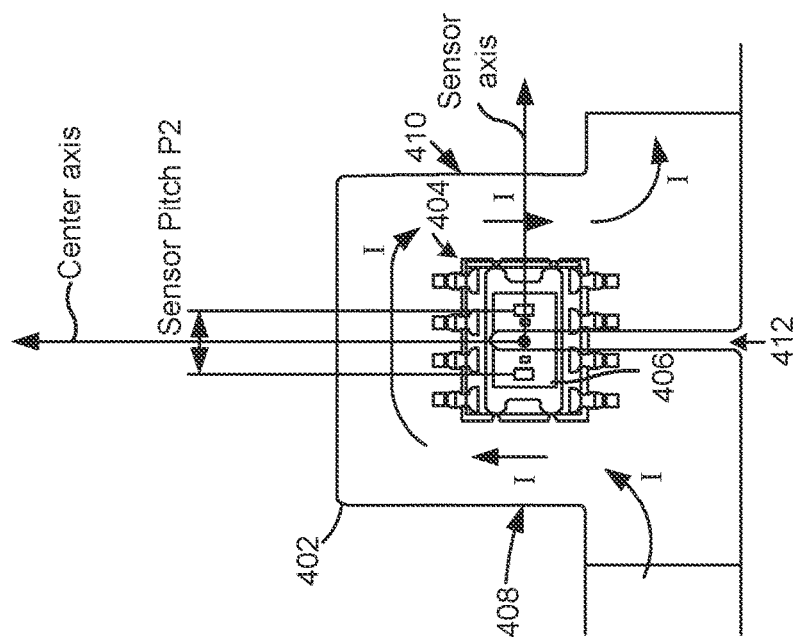
FIG. 4 illustrates a current sensor arrangement according to one or more implementations.

FIG. 4 illustrates a current sensor arrangement 400 according to one or more implementations. The current sensor arrangement 400 may include a conductor 402 configured to carry a current I which produces a magnetic field and a chip package 404 that includes a current sensor 406 (e.g., a magnetic field sensor chip). The current sensor 406 may be similar to the current sensors 200A, 200B, or 200C described above in connection with FIGS. 2A-2C. Accordingly, the current sensor 406 may include the first sensor bridge 204a, the second sensor bridge 204b, the third sensor bridge 206a, the fourth sensor bridge 206b, the fifth sensor bridge 208a, or the sixth sensor bridge 208b that are differentially spaced with respect to the center axis in the manner described above in connection with FIGS. 2A-2C.

The conductor 402 may be a current rail, a bus bar, or another conductor having a U-shape that carries a current I to be measured. The conductor 402 includes a first conductor segment 408 that is configured to carry the current I in a first current direction that is parallel to the center axis and a second conductor segment 410 that is configured to carry the current I in a second current direction that is antiparallel (e.g., opposite) to the first current direction. The center axis of the current sensor 406 may be arranged over a gap 412 in an out-of-plane direction of the current sensor 406 (e.g., the z-direction). The gap 412 is laterally interposed between the first conductor segment 408 and the second conductor segment 410 (e.g., along the x-axis). Thus, the center axis of the current sensor 406 may be centered over a gap 412 such that the current sensor 406 is symmetrically arranged over the conductor 402.

The first sensor bridge 204a, the third sensor bridge 206a, and the fifth sensor bridge 208a are laterally displaced from the center axis in the first direction such that sensing elements of the first sensor bridge 204a, the third sensor bridge 206a, and the fifth sensor bridge 208a overlap with the first conductor segment 408 in the out-of-plane direction. The second sensor bridge 204b, the fourth sensor bridge 206b, and the sixth sensor bridge 208b are laterally displaced from the center axis in the second direction, opposite to the first direction, such that sensing elements of the second sensor bridge 204b, the fourth sensor bridge 206b, and the sixth sensor bridge 208b overlap with the second conductor segment 410 in the out-of-plane direction. Accordingly, each magnetic field sensor circuit of the magnetic field sensor circuits 204, 206, and 208 is arranged to sense a differential magnetic field produced by the current I flowing through the conductor 402.

The number and arrangement of components shown in FIG. 4 are provided as an example. In practice, the current sensor arrangement 400 may include additional components, fewer components, different components, or differently arranged components than those shown in FIG. 4.

Figure 5:
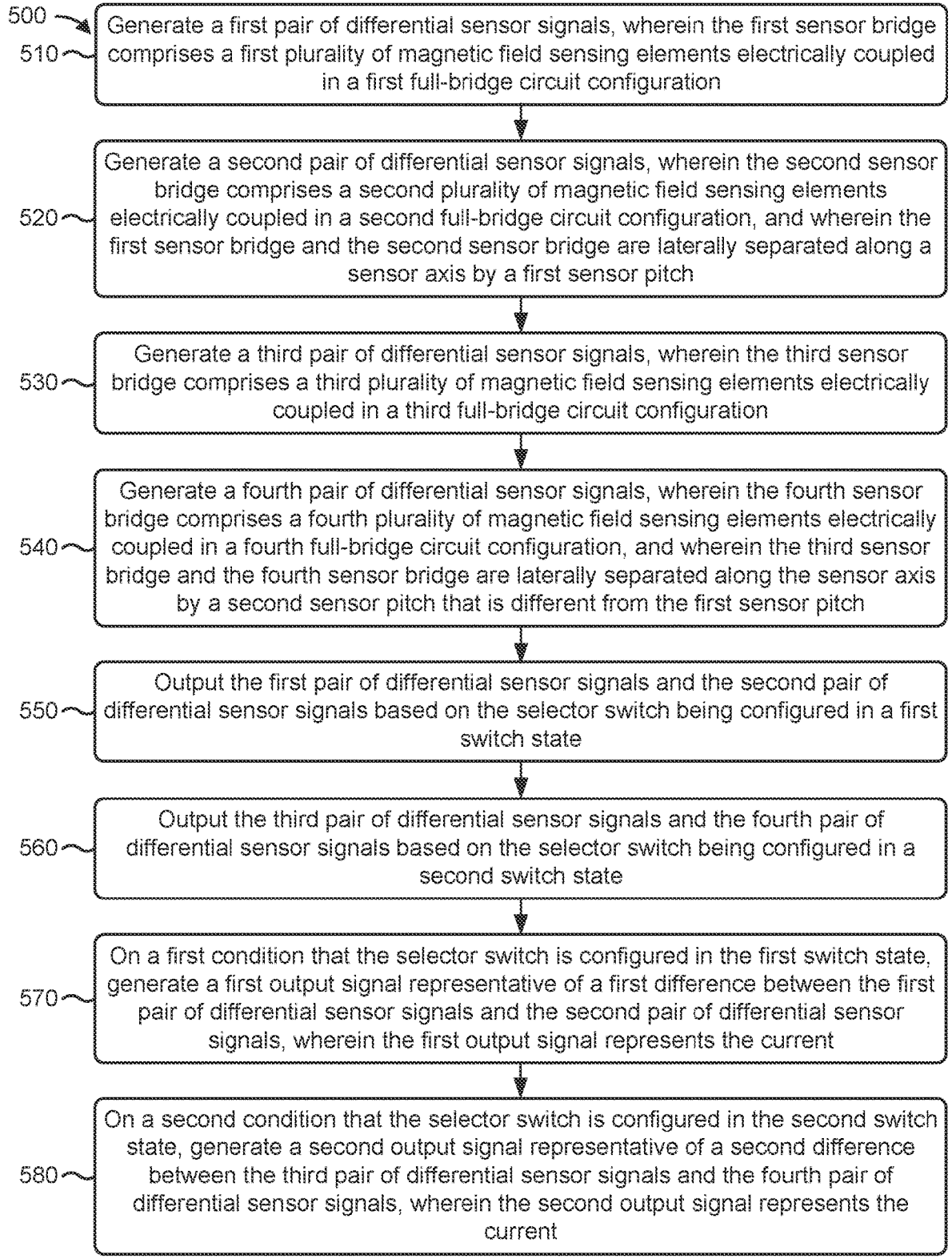
FIG. 5 is a flowchart of an example process associated with adjustable sensitivity ranges for magnetic field sensors.

FIG. 5 is a flowchart of an example process 500 associated with adjustable sensitivity ranges for magnetic field sensors. In some implementations, one or more process blocks of FIG. 5 are performed by a magnetic field sensor (e.g., magnetic field sensor 100 or current sensor 200A, 200B, or 200C). Additionally, or alternatively, one or more process blocks of FIG. 5 may be performed by one or more components of the current sensor, such as sensing elements (e.g., the sensing elements 110), a selector switch (e.g., the selector switch 210), and/or a differential circuit (e.g., differential circuit 212).

As shown in FIG. 5, process 500 may include generating a first pair of differential sensor signals by a first sensor bridge that comprises a first plurality of magnetic field sensing elements electrically coupled in a first full-bridge circuit configuration (block 510). For example, the first sensor bridge 204a may generate a first pair of differential sensor signals as described above.

As further shown in FIG. 5, process 500 may include generating a second pair of differential sensor signals by a second sensor bridge that comprises a second plurality of magnetic field sensing elements electrically coupled in a second full-bridge circuit configuration (block 520). For example, the second sensor bridge 204b may generate a second pair of differential sensor signals, as described above.

As further shown in FIG. 5, process 500 may include generating a third pair of differential sensor signals by a third sensor bridge that comprises a third plurality of magnetic field sensing elements electrically coupled in a third full-bridge circuit configuration (block 530). For example, the third sensor bridge 206a may generate a third pair of differential sensor signals, as described above.

As further shown in FIG. 5, process 500 may include generating a fourth pair of differential sensor signals by a fourth sensor bridge that comprises a fourth plurality of magnetic field sensing elements electrically coupled in a fourth full-bridge circuit configuration (block 540). For example, the fourth sensor bridge 206b may generate a fourth pair of differential sensor signals, as described above.

As further shown in FIG. 5, process 500 may include outputting the first pair of differential sensor signals and the second pair of differential sensor signals based on a selector switch being configured in a first switch state of a plurality of switch states (block 550). For example, the selector switch 210 may output the first pair of differential sensor signals and the second pair of differential sensor signals based on the selector switch 210 being configured in a first switch state of a plurality of switch states, as described above.

As further shown in FIG. 5, process 500 may include outputting the third pair of differential sensor signals and the fourth pair of differential sensor signals based on the selector switch being configured in a second switch state of the plurality of switch states (block 560). For example, the selector switch 210 may output the third pair of differential sensor signals and the fourth pair of differential sensor signals based on the selector switch 210 being configured in a second switch state of the plurality of switch states, as described above.

As further shown in FIG. 5, process 500 may include, on a first condition that the selector switch is configured in the first switch state, generating a first output signal representative of a first difference between the first pair of differential sensor signals and the second pair of differential sensor signals, wherein the first output signal represents the current (block 570). For example, the current sensor may, on a first condition that the selector switch is configured in the first switch state, generate a first output signal representative of a first difference between the first pair of differential sensor signals and the second pair of differential sensor signals, wherein the first output signal represents the current, as described above.

As further shown in FIG. 5, process 500 may include, on a second condition that the selector switch is configured in the second switch state, generating a second output signal representative of a second difference between the third pair of differential sensor signals and the fourth pair of differential sensor signals, wherein the second output signal represents the current (block 580). For example, the current sensor may, on a second condition that the selector switch is configured in the second switch state, generate a second output signal representative of a second difference between the third pair of differential sensor signals and the fourth pair of differential sensor signals, wherein the second output signal represents the current, as described above.

With a range selector switch, such as the selector switch 210, and different pairs of full-bridge circuits being arranged at different sensor pitches, the range selector switch may be used to enable one of the pairs of full-bridge circuits to achieve an implicit scaling and a selection of different signal ranges. The selection of these elements may be either done in a fixed manner (e.g., as different product variants) or via a programmable memory which is on chip to allow flexible adaption to different signal ranges.

Process 500 may include additional implementations, such as any single implementation or any combination of implementations described below and/or in connection with one or more other processes described elsewhere herein.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

The following provides an overview of some Aspects of the present disclosure:

Aspect 1: A current sensor, comprising: a first magnetic field sensor circuit comprising a first plurality of sensor bridges including a first sensor bridge configured to generate a first pair of differential sensor signals and a second sensor bridge configured to generate a second pair of differential sensor signals, wherein the first sensor bridge and the second sensor bridge are laterally separated along a sensor axis by a first sensor pitch, wherein the first sensor bridge comprises a first plurality of magnetic field sensing elements electrically coupled in a first full-bridge circuit configuration, and wherein the second sensor bridge comprises a second plurality of magnetic field sensing elements electrically coupled in a second full-bridge circuit configuration; a second magnetic field sensor circuit comprising a second plurality of sensor bridges including a third sensor bridge configured to generate a third pair of differential sensor signals and a fourth sensor bridge configured to generate a fourth pair of differential sensor signals, wherein the third sensor bridge and the fourth sensor bridge are laterally separated along the sensor axis by a second sensor pitch that is different from the first sensor pitch, wherein the third sensor bridge comprises a third plurality of magnetic field sensing elements electrically coupled in a third full-bridge circuit configuration, and wherein the fourth sensor bridge comprises a fourth plurality of magnetic field sensing elements electrically coupled in a fourth full-bridge circuit configuration; a selector switch configurable in a plurality of switch states, wherein the selector switch is configured to simultaneously receive the first pair of differential sensor signals, the second pair of differential sensor signals, the third pair of differential sensor signals, and the fourth pair of differential sensor signals, output the first pair of differential sensor signals and the second pair of differential sensor signals if configured in a first switch state of the plurality of switch states, and output the third pair of differential sensor signals and the fourth pair of differential sensor signals if configured in a second switch state of the plurality of switch states; and a differential circuit coupled to the selector switch, wherein, if the selector switch is configured in the first switch state, the differential circuit is configured to receive the first pair of differential sensor signals and the second pair of differential sensor signals, and generate a first output signal representative of a first difference between the first pair of differential sensor signals and the second pair of differential sensor signals, and wherein, if the selector switch is configured in the second switch state, the differential circuit is configured to receive the third pair of differential sensor signals and the fourth pair of differential sensor signals, and generate a second output signal representative of a second difference between the third pair of differential sensor signals and the fourth pair of differential sensor signals.

Aspect 2: The current sensor of Aspect 1, wherein the first magnetic field sensor circuit has a first sensor sensitivity corresponding to the first sensor pitch, and wherein the second magnetic field sensor circuit has a second sensor sensitivity corresponding to the second sensor pitch.

Aspect 3: The current sensor of Aspect 2, wherein the first sensor sensitivity is matched to a first signal range and the second sensor sensitivity is matched to a second signal range that is smaller than the first signal range.

Aspect 4: The current sensor of Aspect 2, wherein the first sensor sensitivity is matched to a first range of magnetic flux densities and the second sensor sensitivity is matched to a second range of magnetic flux densities, wherein the first range of magnetic flux densities is defined by a first maximum flux density and the second range of magnetic flux densities is defined by a second maximum flux density that is less than the first maximum flux density.

Aspect 5: The current sensor of Aspect 2, wherein first sensor pitch is smaller than the second sensor pitch, and wherein the first sensor sensitivity is less than the second sensor sensitivity.

Aspect 6: The current sensor of any of Aspects 1-5, wherein the first sensor pitch is a first distance between a first center of the first sensor bridge and a second center of the second sensor bridge, and wherein the second sensor pitch is a third distance between a third center of the third sensor bridge and a fourth center of the fourth sensor bridge, wherein the second sensor pitch is a third distance between a third center of the third sensor bridge and a fourth center of the fourth sensor bridge.

Aspect 7: The current sensor of any of Aspects 1-6, wherein the differential circuit is configured to generate the first output signal based on a first magnetic field produced by a first current and generate the second output signal based on a second magnetic field produced by a second current, wherein the first current has a first maximum amplitude, and wherein the second current has a second maximum amplitude that is smaller than the first maximum amplitude.

Aspect 8: The current sensor of Aspect 7, wherein the first sensor pitch is smaller than the second sensor pitch.

Aspect 9: The current sensor of Aspect 7, further comprising: a controller configured to set the selector switch into the first switch state or the second switch state, wherein the controller is configured to set the selector switch into the first switch state for measuring the first current and the controller is configured to set the selector switch into the second switch state for measuring the second current.

Aspect 10: The current sensor of any of Aspects 1-9, wherein the first plurality of magnetic field sensing elements, the second plurality of magnetic field sensing elements, the third plurality of magnetic field sensing elements, and the fourth plurality of magnetic field sensing elements are sensitive to a magnetic field component aligned with the sensor axis.

Aspect 11: The current sensor of Aspect 10, wherein the first plurality of magnetic field sensing elements, the second plurality of magnetic field sensing elements, the third plurality of magnetic field sensing elements, and the fourth plurality of magnetic field sensing elements have substantially a same magnitude of sensitivity to the magnetic field component aligned with the sensor axis.

Aspect 12: The current sensor of any of Aspects 1-11, wherein the first sensor bridge and the second sensor bridge are differentially offset from a center axis along the sensor axis by a first distance, wherein the third sensor bridge and the fourth sensor bridge are differentially offset from the center axis along the sensor axis by a second distance that is greater than the first distance, and wherein the center axis and the sensor axis are perpendicular to each other.

Aspect 13: The current sensor of Aspect 2, wherein the first sensor bridge and the third sensor bridge are positioned on a first side of the center axis and the second sensor bridge and the fourth sensor bridge are positioned on a second side of the center axis.

Aspect 14: The current sensor of any of Aspects 1-13, wherein the first sensor bridge is arranged substantially symmetric to the second sensor bridge about a center axis, wherein the first sensor bridge is laterally separated from the center axis in a first direction along the sensor axis by a first distance, and wherein the second sensor bridge is laterally separated from the center axis in a second direction along the sensor axis by the first distance, wherein the third sensor bridge is arranged substantially symmetric to the fourth sensor bridge about the center axis, wherein the third sensor bridge is laterally separated from the center axis in the first direction along the sensor axis by a second distance, and wherein the fourth sensor bridge is laterally separated from the center axis in the second direction along the sensor axis by the second distance, and wherein the center axis and the sensor axis are perpendicular to each other.

Aspect 15: The current sensor of any of Aspects 1-14, further comprising: a magnetic field sensor chip comprising a chip surface, wherein the first plurality of sensor bridges and the second plurality of sensor bridges are arranged on the chip surface.

Aspect 16: The current sensor of Aspect 14, wherein the first plurality of magnetic field sensing elements are arranged substantially symmetric to the second plurality of magnetic field sensing elements about a center axis, wherein the first plurality of magnetic field sensing elements are laterally separated from the center axis in a first direction according to the first sensor pitch, and wherein the second plurality of magnetic field sensing elements are laterally separated from the center axis in a second direction according to the first sensor pitch, wherein the third plurality of magnetic field sensing elements are arranged substantially symmetric to the fourth plurality of magnetic field sensing elements about the center axis, wherein the third plurality of magnetic field sensing elements are laterally separated from the center axis in the first direction according to the second sensor pitch, and wherein the fourth plurality of magnetic field sensing elements are laterally separated from the center axis in the second direction according to the second sensor pitch, and wherein the center axis and the sensor axis are perpendicular to each other.

Aspect 17: The current sensor of any of Aspects 1-16, wherein the differential circuit has a fixed gain, wherein the differential circuit is configured to generate the first output signal based on the fixed gain and generate the second output signal based on the fixed gain.

Aspect 18: The current sensor of any of Aspects 1-17, wherein the differential circuit is configured to receive the first pair of differential sensor signals and generate a first measurement signal representative of a difference between the first pair of differential sensor signals, wherein the differential circuit is configured to receive the second pair of differential sensor signals and generate a second measurement signal representative of a difference between the second pair of differential sensor signals, wherein the differential circuit is configured to receive the third pair of differential sensor signals and generate a third measurement signal representative of a difference between the third pair of differential sensor signals, wherein the differential circuit is configured to receive the fourth pair of differential sensor signals and generate a fourth measurement signal representative of a difference between the fourth pair of differential sensor signals, wherein the differential circuit is configured to generate the first output signal based on a difference between the first measurement signal and the second measurement signal, and wherein the differential circuit is configured to generate the second output signal based on a difference between the third measurement signal and the fourth measurement signal.

Aspect 19: The current sensor of any of Aspects 1-18, wherein the differential circuit is a double differential amplifier with a fixed gain.

Aspect 20: The current sensor of any of Aspects 1-19, further comprising: a third magnetic field sensor circuit comprising a third plurality of sensor bridges including a fifth sensor bridge configured to generate a fifth pair of differential sensor signals and a sixth sensor bridge configured to generate a sixth pair of differential sensor signals, wherein the fifth sensor bridge and the sixth sensor bridge are laterally separated along the sensor axis by a third sensor pitch that is different from the first sensor pitch and the second sensor pitch, wherein the fifth sensor bridge comprises a fifth plurality of magnetic field sensing elements electrically coupled in a fifth full-bridge circuit configuration, and wherein the sixth sensor bridge comprises a sixth plurality of magnetic field sensing elements electrically coupled in a sixth full-bridge circuit configuration, wherein the selector switch is configured to simultaneously receive the first pair of differential sensor signals, the second pair of differential sensor signals, the third pair of differential sensor signals, the fourth pair of differential sensor signals, the fifth pair of differential sensor signals, and the sixth pair of differential sensor signals, and output the fifth pair of differential sensor signals and the sixth pair of differential sensor signals if configured in a third switch state of the plurality of switch states, and wherein, if the selector switch is configured in the third switch state, the differential circuit is configured to receive the fifth pair of differential sensor signals and the sixth pair of differential sensor signals and generate a third output signal representative of a third difference between the fifth pair of differential sensor signals and the fourth pair of differential sensor signals.

Aspect 21: A current sensor, comprising: a first magnetic field sensor circuit comprising a first sensor bridge circuit configured to generate a first differential sensor signal and a second sensor bridge circuit configured to generate a second differential sensor signal, wherein the first sensor bridge circuit comprises a first sensor bridge comprising a first plurality of magnetic field sensing elements electrically coupled in a first full-bridge circuit configuration, wherein the second sensor bridge circuit comprises a second sensor bridge comprising a second plurality of magnetic field sensing elements electrically coupled in a second full-bridge circuit configuration, and wherein the first sensor bridge and the second sensor bridge are laterally separated along a sensor axis by a first sensor pitch; a second magnetic field sensor circuit comprising a third sensor bridge circuit configured to generate a third differential sensor signal and a fourth sensor bridge circuit configured to generate a fourth differential sensor signal, wherein the third sensor bridge circuit comprises a third sensor bridge comprising a third plurality of magnetic field sensing elements electrically coupled in a third full-bridge circuit configuration, and wherein the fourth sensor bridge circuit comprises a fourth sensor bridge comprising a fourth plurality of magnetic field sensing elements electrically coupled in a fourth full-bridge circuit configuration, wherein the third sensor bridge and the fourth sensor bridge are laterally separated along the sensor axis by a second sensor pitch that is different from the first sensor pitch; a selector switch configurable in a plurality of switch states, wherein the selector switch is configured to simultaneously receive the first differential sensor signal, the second differential sensor signal, the third differential sensor signal, and the fourth differential sensor signal, output the first differential sensor signal and the second differential sensor signal if configured in a first switch state of the plurality of switch states, and output the third differential sensor signal and the fourth differential sensor signal if configured in a second switch state of the plurality of switch states; and a differential circuit coupled to the selector switch, wherein, if the selector switch is configured in the first switch state, the differential circuit is configured to receive the first differential sensor signal and the second differential sensor signal, and generate a first output signal representative of a first difference between the first differential sensor signal and the second differential sensor signal, and wherein, if the selector switch is configured in the second switch state, the differential circuit is configured to receive the third differential sensor signal and the fourth differential sensor signal, and generate a second output signal representative of a second difference between the third differential sensor signal and the fourth differential sensor signal.

Aspect 22: A method for measuring a current, comprising: generating, by a first sensor bridge, a first pair of differential sensor signals, wherein the first sensor bridge comprises a first plurality of magnetic field sensing elements electrically coupled in a first full-bridge circuit configuration; generating, by a second sensor bridge, a second pair of differential sensor signals, wherein the second sensor bridge comprises a second plurality of magnetic field sensing elements electrically coupled in a second full-bridge circuit configuration, and wherein the first sensor bridge and the second sensor bridge are laterally separated along a sensor axis by a first sensor pitch; generating, by a third sensor bridge, a third pair of differential sensor signals, wherein the third sensor bridge comprises a third plurality of magnetic field sensing elements electrically coupled in a third full-bridge circuit configuration; generating, by a fourth sensor bridge, a fourth pair of differential sensor signals, wherein the fourth sensor bridge comprises a fourth plurality of magnetic field sensing elements electrically coupled in a fourth full-bridge circuit configuration, and wherein the third sensor bridge and the fourth sensor bridge are laterally separated along the sensor axis by a second sensor pitch that is different from the first sensor pitch; outputting, by a selector switch, the first pair of differential sensor signals and the second pair of differential sensor signals based on the selector switch being configured in a first switch state of a plurality of switch states; outputting, by a selector switch, the third pair of differential sensor signals and the fourth pair of differential sensor signals based on the selector switch being configured in a second switch state of the plurality of switch states; on a first condition that the selector switch is configured in the first switch state, generating a first output signal representative of a first difference between the first pair of differential sensor signals and the second pair of differential sensor signals, wherein the first output signal represents the current; and on a second condition that the selector switch is configured in the second switch state, generating a second output signal representative of a second difference between the third pair of differential sensor signals and the fourth pair of differential sensor signals, wherein the second output signal represents the current.

Aspect 23: A system configured to perform one or more operations recited in one or more of Aspects 1-22.

Aspect 24: An apparatus comprising means for performing one or more operations recited in one or more of Aspects 1-22.

Aspect 25: A non-transitory computer-readable medium storing a set of instructions, the set of instructions comprising one or more instructions that, when executed by a device, cause the device to perform one or more operations recited in one or more of Aspects 1-22.

Aspect 26: A computer program product comprising instructions or code for executing one or more operations recited in one or more of Aspects 1-22.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein refers to any of the foregoing structures or any other structure suitable for implementation of the techniques described herein.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A current sensor, comprising:
a first magnetic field sensor circuit comprising a first plurality of sensor bridges including a first sensor bridge configured to generate a first pair of differential sensor signals and a second sensor bridge configured to generate a second pair of differential sensor signals, wherein the first sensor bridge and the second sensor bridge are laterally separated along a sensor axis by a first sensor pitch, wherein the first sensor bridge comprises a first plurality of magnetic field sensing elements electrically coupled in a first full-bridge circuit configuration, and wherein the second sensor bridge comprises a second plurality of magnetic field sensing elements electrically coupled in a second full-bridge circuit configuration;
a second magnetic field sensor circuit comprising a second plurality of sensor bridges including a third sensor bridge configured to generate a third pair of differential sensor signals and a fourth sensor bridge configured to generate a fourth pair of differential sensor signals, wherein the third sensor bridge and the fourth sensor bridge are laterally separated along the sensor axis by a second sensor pitch that is different from the first sensor pitch, wherein the third sensor bridge comprises a third plurality of magnetic field sensing elements electrically coupled in a third full-bridge circuit configuration, and wherein the fourth sensor bridge comprises a fourth plurality of magnetic field sensing elements electrically coupled in a fourth full-bridge circuit configuration;

a selector switch configurable in a plurality of switch states, wherein the selector switch is configured to simultaneously receive the first pair of differential sensor signals, the second pair of differential sensor signals, the third pair of differential sensor signals, and the fourth pair of differential sensor signals, output the first pair of differential sensor signals and the second pair of differential sensor signals if configured in a first switch state of the plurality of switch states, and output the third pair of differential sensor signals and the fourth pair of differential sensor signals if configured in a second switch state of the plurality of switch states; and a differential circuit coupled to the selector switch, wherein, if the selector switch is configured in the first switch state, the differential circuit is configured to receive the first pair of differential sensor signals and the second pair of differential sensor signals, and generate a first output signal representative of a first difference between the first pair of differential sensor signals and the second pair of differential sensor signals, and wherein, if the selector switch is configured in the second switch state, the differential circuit is configured to receive the third pair of differential sensor signals and the fourth pair of differential sensor signals, and generate a second output signal representative of a second difference between the third pair of differential sensor signals and the fourth pair of differential sensor signals.

2. The current sensor of claim 1, wherein the first magnetic field sensor circuit has a first sensor sensitivity corresponding to the first sensor pitch, and
wherein the second magnetic field sensor circuit has a second sensor sensitivity corresponding to the second sensor pitch.

3. The current sensor of claim 2, wherein the first sensor sensitivity is matched to a first signal range and the second sensor sensitivity is matched to a second signal range that is smaller than the first signal range.

4. The current sensor of claim 2, wherein the first sensor sensitivity is matched to a first range of magnetic flux densities and the second sensor sensitivity is matched to a second range of magnetic flux densities, wherein the first range of magnetic flux densities is defined by a first maximum flux density and the second range of magnetic flux densities is defined by a second maximum flux density that is less than the first maximum flux density.

5. The current sensor of claim 2, wherein first sensor pitch is smaller than the second sensor pitch, and
wherein the first sensor sensitivity is less than the second sensor sensitivity.

6. The current sensor of claim 1, wherein the first sensor pitch is a first distance between a first center of the first sensor bridge and a second center of the second sensor bridge, and
wherein the second sensor pitch is a second distance between a third center of the third sensor bridge and a fourth center of the fourth sensor bridge.

7. The current sensor of claim 1, wherein the differential circuit is configured to generate the first output signal based on a first magnetic field produced by a first current and generate the second output signal based on a second magnetic field produced by a second current,
wherein the first current has a first maximum amplitude, and
wherein the second current has a second maximum amplitude that is smaller than the first maximum amplitude.

8. The current sensor of claim 7, wherein the first sensor pitch is smaller than the second sensor pitch.

9. The current sensor of claim 7, further comprising:
a controller configured to set the selector switch into the first switch state or the second switch state,
wherein the controller is configured to set the selector switch into the first switch state for measuring the first current and the controller is configured to set the selector switch into the second switch state for measuring the second current.

10. The current sensor of claim 1, wherein the first plurality of magnetic field sensing elements, the second plurality of magnetic field sensing elements, the third plurality of magnetic field sensing elements, and the fourth plurality of magnetic field sensing elements are sensitive to a magnetic field component aligned with the sensor axis.

11. The current sensor of claim 10, wherein the first plurality of magnetic field sensing elements, the second plurality of magnetic field sensing elements, the third plurality of magnetic field sensing elements, and the fourth plurality of magnetic field sensing elements have substantially a same magnitude of sensitivity to the magnetic field component aligned with the sensor axis.

12. The current sensor of claim 1, wherein the first sensor bridge and the second sensor bridge are differentially offset from a center axis along the sensor axis by a first distance,
wherein the third sensor bridge and the fourth sensor bridge are differentially offset from the center axis along the sensor axis by a second distance that is greater than the first distance, and
wherein the center axis and the sensor axis are perpendicular to each other.

13. The current sensor of claim 12, wherein the first sensor bridge and the third sensor bridge are positioned on a first side of the center axis and the second sensor bridge and the fourth sensor bridge are positioned on a second side of the center axis.

14. The current sensor of claim 1, wherein the first sensor bridge is arranged substantially symmetric to the second sensor bridge about a center axis, wherein the first sensor bridge is laterally separated from the center axis in a first direction along the sensor axis by a first distance, and wherein the second sensor bridge is laterally separated from the center axis in a second direction along the sensor axis by the first distance,
wherein the third sensor bridge is arranged substantially symmetric to the fourth sensor bridge about the center axis, wherein the third sensor bridge is laterally separated from the center axis in the first direction along the sensor axis by a second distance, and wherein the fourth sensor bridge is laterally separated from the center axis in the second direction along the sensor axis by the second distance, and
wherein the center axis and the sensor axis are perpendicular to each other.

15. The current sensor of claim 1, further comprising:
a magnetic field sensor chip comprising a chip surface,
wherein the first plurality of sensor bridges and the second plurality of sensor bridges are arranged on the chip surface.

16. The current sensor of claim 14, wherein the first plurality of magnetic field sensing elements are arranged substantially symmetric to the second plurality of magnetic field sensing elements about a center axis, wherein the first plurality of magnetic field sensing elements are laterally separated from the center axis in a first direction according to the first sensor pitch, and wherein the second plurality of magnetic field sensing elements are laterally separated from the center axis in a second direction according to the first sensor pitch,
  wherein the third plurality of magnetic field sensing elements are arranged substantially symmetric to the fourth plurality of magnetic field sensing elements about the center axis, wherein the third plurality of magnetic field sensing elements are laterally separated from the center axis in the first direction according to the second sensor pitch, and wherein the fourth plurality of magnetic field sensing elements are laterally separated from the center axis in the second direction according to the second sensor pitch, and
  wherein the center axis and the sensor axis are perpendicular to each other.

17. The current sensor of claim 1, wherein the differential circuit has a fixed gain, wherein the differential circuit is configured to generate the first output signal based on the fixed gain and generate the second output signal based on the fixed gain.

18. The current sensor of claim 1, wherein the differential circuit is configured to receive the first pair of differential sensor signals and generate a first measurement signal representative of a difference between the first pair of differential sensor signals,
  wherein the differential circuit is configured to receive the second pair of differential sensor signals and generate a second measurement signal representative of a difference between the second pair of differential sensor signals,
  wherein the differential circuit is configured to receive the third pair of differential sensor signals and generate a third measurement signal representative of a difference between the third pair of differential sensor signals,
  wherein the differential circuit is configured to receive the fourth pair of differential sensor signals and generate a fourth measurement signal representative of a difference between the fourth pair of differential sensor signals,
  wherein the differential circuit is configured to generate the first output signal based on a difference between the first measurement signal and the second measurement signal, and
  wherein the differential circuit is configured to generate the second output signal based on a difference between the third measurement signal and the fourth measurement signal.

19. The current sensor of claim 1, wherein the differential circuit is a double differential amplifier with a fixed gain.

20. The current sensor of claim 1, further comprising:
a third magnetic field sensor circuit comprising a third plurality of sensor bridges including a fifth sensor bridge configured to generate a fifth pair of differential sensor signals and a sixth sensor bridge configured to generate a sixth pair of differential sensor signals, wherein the fifth sensor bridge and the sixth sensor bridge are laterally separated along the sensor axis by a third sensor pitch that is different from the first sensor pitch and the second sensor pitch, wherein the fifth sensor bridge comprises a fifth plurality of magnetic field sensing elements electrically coupled in a fifth full-bridge circuit configuration, and wherein the sixth sensor bridge comprises a sixth plurality of magnetic field sensing elements electrically coupled in a sixth full-bridge circuit configuration,
  wherein the selector switch is configured to simultaneously receive the first pair of differential sensor signals, the second pair of differential sensor signals, the third pair of differential sensor signals, the fourth pair of differential sensor signals, the fifth pair of differential sensor signals, and the sixth pair of differential sensor signals, and output the fifth pair of differential sensor signals and the sixth pair of differential sensor signals if configured in a third switch state of the plurality of switch states, and
  wherein, if the selector switch is configured in the third switch state, the differential circuit is configured to receive the fifth pair of differential sensor signals and the sixth pair of differential sensor signals and generate a third output signal representative of a third difference between the fifth pair of differential sensor signals and the sixth pair of differential sensor signals.

21. A current sensor, comprising:
a first magnetic field sensor circuit comprising a first sensor bridge circuit configured to generate a first differential sensor signal and a second sensor bridge circuit configured to generate a second differential sensor signal, wherein the first sensor bridge circuit comprises a first sensor bridge comprising a first plurality of magnetic field sensing elements electrically coupled in a first full-bridge circuit configuration, wherein the second sensor bridge circuit comprises a second sensor bridge comprising a second plurality of magnetic field sensing elements electrically coupled in a second full-bridge circuit configuration, and wherein the first sensor bridge and the second sensor bridge are laterally separated along a sensor axis by a first sensor pitch;
a second magnetic field sensor circuit comprising a third sensor bridge circuit configured to generate a third differential sensor signal and a fourth sensor bridge circuit configured to generate a fourth differential sensor signal, wherein the third sensor bridge circuit comprises a third sensor bridge comprising a third plurality of magnetic field sensing elements electrically coupled in a third full-bridge circuit configuration, and wherein the fourth sensor bridge circuit comprises a fourth sensor bridge comprising a fourth plurality of magnetic field sensing elements electrically coupled in a fourth full-bridge circuit configuration, wherein the third sensor bridge and the fourth sensor bridge are laterally separated along the sensor axis by a second sensor pitch that is different from the first sensor pitch;
a selector switch configurable in a plurality of switch states, wherein the selector switch is configured to simultaneously receive the first differential sensor signal, the second differential sensor signal, the third differential sensor signal, and the fourth differential sensor signal, output the first differential sensor signal and the second differential sensor signal if configured in a first switch state of the plurality of switch states, and output the third differential sensor signal and the fourth differential sensor signal if configured in a second switch state of the plurality of switch states; and
a differential circuit coupled to the selector switch,
  wherein, if the selector switch is configured in the first switch state, the differential circuit is configured to receive the first differential sensor signal and the second differential sensor signal, and generate a first output signal representative of a first difference between the first differential sensor signal and the second differential sensor signal, and wherein, if the selector switch is configured in the second switch state, the differential circuit is configured to receive the third differential sensor signal and the fourth differential sensor signal, and generate a second output signal representative of a second difference between the third differential sensor signal and the fourth differential sensor signal.

22. A method for measuring a current, comprising:

generating, by a first sensor bridge, a first pair of differential sensor signals, wherein the first sensor bridge comprises a first plurality of magnetic field sensing elements electrically coupled in a first full-bridge circuit configuration;

generating, by a second sensor bridge, a second pair of differential sensor signals, wherein the second sensor bridge comprises a second plurality of magnetic field sensing elements electrically coupled in a second full-bridge circuit configuration, and wherein the first sensor bridge and the second sensor bridge are laterally separated along a sensor axis by a first sensor pitch;

generating, by a third sensor bridge, a third pair of differential sensor signals, wherein the third sensor bridge comprises a third plurality of magnetic field sensing elements electrically coupled in a third full-bridge circuit configuration;

generating, by a fourth sensor bridge, a fourth pair of differential sensor signals, wherein the fourth sensor bridge comprises a fourth plurality of magnetic field sensing elements electrically coupled in a fourth full-bridge circuit configuration, and wherein the third sensor bridge and the fourth sensor bridge are laterally separated along the sensor axis by a second sensor pitch that is different from the first sensor pitch;

outputting, by a selector switch, the first pair of differential sensor signals and the second pair of differential sensor signals based on the selector switch being configured in a first switch state of a plurality of switch states;

outputting, by the selector switch, the third pair of differential sensor signals and the fourth pair of differential sensor signals based on the selector switch being configured in a second switch state of the plurality of switch states;

on a first condition that the selector switch is configured in the first switch state, generating a first output signal representative of a first difference between the first pair of differential sensor signals and the second pair of differential sensor signals, wherein the first output signal represents the current; and on a second condition that the selector switch is configured in the second switch state, generating a second output signal representative of a second difference between the third pair of differential sensor signals and the fourth pair of differential sensor signals, wherein the second output signal represents the current.

\* \* \* \* \*